US011876161B2

(12) United States Patent
Thiel et al.

(10) Patent No.: US 11,876,161 B2
(45) Date of Patent: *Jan. 16, 2024

(54) MATERIAL FOR DISSIPATING HEAT FROM AND/OR REDUCING HEAT SIGNATURE OF ELECTRONIC DEVICES AND CLOTHING

(71) Applicant: LAT Enterprises, Inc., Raleigh, NC (US)

(72) Inventors: Laura Thiel, Raleigh, NC (US); Carlos Cid, Raleigh, NC (US)

(73) Assignee: LAT ENTERPRISES, INC., Raleigh, NC (US)

( * ) Notice: Subject to any disclaimer, the term of this patent is extended or adjusted under 35 U.S.C. 154(b) by 34 days.

This patent is subject to a terminal disclaimer.

(21) Appl. No.: 17/715,640

(22) Filed: Apr. 7, 2022

(65) Prior Publication Data
US 2022/0231369 A1 Jul. 21, 2022

Related U.S. Application Data

(63) Continuation of application No. 15/470,382, filed on Mar. 27, 2017, now Pat. No. 11,302,987, which is a
(Continued)

(51) Int. Cl.
*H01M 50/24* (2021.01)
*A41D 31/26* (2019.01)
(Continued)

(52) U.S. Cl.
CPC .......... *H01M 50/24* (2021.01); *A41D 31/085* (2019.02); *A41D 31/265* (2019.02);
(Continued)

(58) Field of Classification Search
CPC ............... H01M 50/24; H01M 50/204; H01M 50/271; H01M 50/296; H01M 2220/30;
(Continued)

(56) References Cited

U.S. PATENT DOCUMENTS

| 1,901,232 A | 3/1933 | Glowacki |
| RE21,577 E | 9/1940 | Brownlee |

(Continued)

FOREIGN PATENT DOCUMENTS

| CN | 202931205 U | 5/2013 |
| GB | 2518669 A | 4/2015 |

(Continued)

OTHER PUBLICATIONS

EE-Dan; Repair Your Laptop Power Cord; Instructables.com; published Jun. 11, 2013; https://www.instructables.com/Repair-Your-Laptop-Power-Cord/ (Year: 2013).

(Continued)

*Primary Examiner* — Michael L Dignan

(74) *Attorney, Agent, or Firm* — NEO IP

(57) ABSTRACT

Systems, methods and articles having a heat-shielding or blocking, heat-dissipating and/or heat signature-reducing material layer or coating are disclosed. In one example, the heat-shielding or blocking, heat-dissipating and/or heat signature-reducing material completely covers the interior of a housing having a plurality of battery cells removably disposed therein. Other examples include a heat-shielding or blocking, heat-dissipating and/or heat signature-reducing material layer having anti-static, anti-radio frequency (RF), anti-electromagnetic interference (EMI), anti-tarnish, and/or anti-corrosion materials and properties that effectively protect battery-operated devices and/or the batteries that power them from damage or diminished operation.

20 Claims, 32 Drawing Sheets

Related U.S. Application Data continuation-in-part of application No. 14/516,127, filed on Oct. 16, 2014, now abandoned.

(51) Int. Cl.
| | |
|---|---|
| *A41D 31/08* | (2019.01) |
| *H01M 50/296* | (2021.01) |
| *H01M 50/204* | (2021.01) |
| *H01M 50/271* | (2021.01) |
| *A41D 19/015* | (2006.01) |

(52) U.S. Cl.
CPC ....... *H01M 50/204* (2021.01); *H01M 50/271* (2021.01); *H01M 50/296* (2021.01); *A41D 19/01529* (2013.01); *H01M 2220/30* (2013.01)

(58) Field of Classification Search
CPC ............. H01M 50/262; H01M 50/256; H01M 50/20; H01M 50/247; A41D 31/085; A41D 31/265; A41D 19/01529; Y02E 60/10; Y02E 10/50; H01L 31/048; H02S 30/20; H02S 40/42
See application file for complete search history.

(56) References Cited

U.S. PATENT DOCUMENTS

| | | |
|---|---|---|
| 2,416,984 A | 3/1947 | Farr |
| 2,450,369 A | 9/1948 | Alexander |
| 2,501,725 A | 3/1950 | Knopp |
| 2,800,807 A | 7/1957 | Gomersall et al. |
| 3,926,499 A * | 12/1975 | Bailey .................. H01R 13/506 439/607.41 |
| 3,952,694 A | 4/1976 | McDonald |
| 3,968,348 A | 7/1976 | Stanfield |
| 4,080,677 A | 3/1978 | Koehler |
| 4,081,061 A | 3/1978 | Tucker |
| 4,346,151 A | 8/1982 | Uba et al. |
| 4,656,770 A | 4/1987 | Nuttle |
| 4,872,414 A | 10/1989 | Asquith |
| 4,944,916 A | 7/1990 | Franey |
| 4,979,502 A | 12/1990 | Hunt |
| 5,185,042 A | 2/1993 | Ferguson |
| 5,245,943 A | 9/1993 | Hull et al. |
| 5,326,297 A | 7/1994 | Loughlin |
| 5,421,287 A | 6/1995 | Yonover |
| 5,522,943 A | 6/1996 | Spencer et al. |
| 5,537,022 A | 7/1996 | Huang |
| 5,653,367 A | 8/1997 | Abramson |
| 5,680,026 A | 10/1997 | Lueschen |
| 5,701,067 A | 12/1997 | Kaji et al. |
| 5,724,707 A | 3/1998 | Kirk et al. |
| 5,736,954 A | 4/1998 | Veazey |
| 5,808,865 A | 9/1998 | Alves |
| 5,869,204 A | 2/1999 | Kottke et al. |
| 6,093,884 A | 7/2000 | Toyomura et al. |
| 6,115,277 A | 9/2000 | Plichta et al. |
| 6,193,678 B1 | 2/2001 | Brannon |
| 6,239,701 B1 | 5/2001 | Vasquez et al. |
| 6,259,228 B1 | 7/2001 | Becker et al. |
| 6,303,248 B1 | 10/2001 | Peterson |
| 6,313,396 B1 | 11/2001 | Glenn |
| 6,351,908 B1 | 3/2002 | Thomas |
| 6,380,713 B2 | 4/2002 | Namura |
| 6,396,403 B1 | 5/2002 | Haner |
| 6,415,734 B1 | 7/2002 | LaPuzza |
| 6,546,873 B1 * | 4/2003 | Andrejkovics ......... F42D 1/045 102/202.5 |
| 6,727,197 B1 | 4/2004 | Wilson et al. |
| 6,784,833 B1 | 8/2004 | Evans |
| 6,866,527 B2 | 3/2005 | Potega |
| 6,870,089 B1 | 3/2005 | Gray |
| 6,945,803 B2 | 9/2005 | Potega |
| 7,074,520 B2 | 2/2006 | Probst et al. |
| 7,124,593 B2 | 10/2006 | Feher |
| 7,141,330 B2 | 11/2006 | Aoyama |
| 7,356,934 B2 | 4/2008 | McCambridge et al. |
| 7,494,348 B1 | 2/2009 | Tyler et al. |
| 7,611,255 B1 | 11/2009 | Lagassey |
| 7,624,453 B2 | 12/2009 | Rene et al. |
| 7,695,334 B2 | 4/2010 | Yonover et al. |
| 7,712,645 B2 | 5/2010 | Calkin |
| 7,798,090 B2 | 9/2010 | Hatfield |
| 7,805,114 B1 | 9/2010 | Quintana et al. |
| 7,878,678 B1 | 2/2011 | Stamatatos |
| 8,258,394 B2 | 9/2012 | Baruh |
| 8,415,924 B2 | 4/2013 | Matthias et al. |
| 8,647,777 B2 | 2/2014 | Yasunaga et al. |
| 8,720,762 B2 | 5/2014 | Hilliard et al. |
| 8,736,108 B1 | 5/2014 | Nielson et al. |
| 8,832,981 B2 | 9/2014 | Desaulniers |
| 8,945,328 B2 | 2/2015 | Longinotti-Buitoni et al. |
| 8,984,666 B1 | 3/2015 | LoBue |
| 9,029,681 B1 | 5/2015 | Nielson et al. |
| 9,093,586 B2 | 7/2015 | Lentine et al. |
| 9,138,022 B2 | 9/2015 | Walker |
| 9,141,143 B2 | 9/2015 | Morita |
| 9,143,053 B1 | 9/2015 | Lentine et al. |
| 9,144,255 B1 | 9/2015 | Perciballi |
| 9,496,448 B2 | 11/2016 | Cruz-Campa et al. |
| 9,508,881 B2 | 11/2016 | Tauke-Pedretti et al. |
| 9,531,322 B2 | 12/2016 | Okandan et al. |
| 9,548,411 B2 | 1/2017 | Nielson et al. |
| 9,559,219 B1 | 1/2017 | Okandan et al. |
| 9,709,362 B2 | 7/2017 | Shelley |
| 9,780,344 B2 | 10/2017 | Thiel et al. |
| 10,281,240 B2 | 5/2019 | Cole et al. |
| 10,531,590 B2 | 1/2020 | Thiel et al. |
| 2002/0074370 A1 | 6/2002 | Quintana et al. |
| 2002/0178558 A1 | 12/2002 | Doshi et al. |
| 2003/0029494 A1 | 2/2003 | Ohkubo |
| 2003/0038611 A1 | 2/2003 | Morgan |
| 2003/0098060 A1 | 5/2003 | Yoshimi |
| 2003/0165744 A1 | 9/2003 | Schubert et al. |
| 2004/0154076 A1 | 8/2004 | Yoo |
| 2004/0237178 A1 | 12/2004 | Landeros |
| 2005/0151930 A1 | 7/2005 | Harris |
| 2005/0161079 A1 | 7/2005 | Gray |
| 2005/0210722 A1 | 9/2005 | Graef et al. |
| 2006/0147172 A1 | 7/2006 | Luther et al. |
| 2006/0225781 A1 | 10/2006 | Locher |
| 2006/0267547 A1 | 11/2006 | Godovich |
| 2007/0030146 A1 | 2/2007 | Shepherd |
| 2007/0061941 A1 | 3/2007 | Makabe et al. |
| 2007/0099488 A1 | 5/2007 | Huffman et al. |
| 2007/0125815 A1 | 6/2007 | Tong |
| 2007/0222410 A1 | 9/2007 | Lee |
| 2007/0245444 A1 | 10/2007 | Brink |
| 2007/0295772 A1 | 12/2007 | Woodmansee |
| 2008/0052439 A1 | 2/2008 | Young et al. |
| 2008/0190476 A1 | 8/2008 | Baruh |
| 2008/0223428 A1 | 9/2008 | Zeira |
| 2008/0223431 A1 | 9/2008 | Chu |
| 2008/0231225 A1 | 9/2008 | Lin |
| 2009/0004909 A1 | 1/2009 | Puzio et al. |
| 2009/0039122 A1 | 2/2009 | Antonioni |
| 2009/0044852 A1 | 2/2009 | Shadbolt et al. |
| 2009/0114690 A1 | 5/2009 | Landay |
| 2009/0131165 A1 | 5/2009 | Buchner et al. |
| 2009/0164174 A1 | 6/2009 | Bears et al. |
| 2009/0229655 A1 | 9/2009 | Lee |
| 2009/0272773 A1 | 11/2009 | Andrade |
| 2009/0279810 A1 | 11/2009 | Nobles |
| 2010/0008028 A1 * | 1/2010 | Richardson .......... A45C 13/005 361/679.01 |
| 2010/0147604 A1 | 6/2010 | Sakita |
| 2010/0253501 A1 | 10/2010 | Gibson |
| 2010/0287681 A1 | 11/2010 | Storms, Jr. et al. |
| 2010/0300744 A1 * | 12/2010 | Romanko ............ H05K 9/0088 174/388 |
| 2011/0059642 A1 | 3/2011 | Slippy et al. |
| 2011/0064983 A1 | 3/2011 | Yokoyama et al. |
| 2011/0097069 A1 | 4/2011 | Braithwaite |

(56) References Cited

U.S. PATENT DOCUMENTS

| | | |
|---|---|---|
| 2011/0100425 A1 | 5/2011 | Osamura et al. |
| 2011/0162690 A1 | 7/2011 | Workman et al. |
| 2011/0173731 A1 | 7/2011 | McElroy et al. |
| 2011/0183183 A1 | 7/2011 | Grady et al. |
| 2011/0204114 A1 | 8/2011 | Miller |
| 2011/0277809 A1 | 11/2011 | Dalland et al. |
| 2011/0290683 A1 | 12/2011 | High et al. |
| 2011/0291607 A1 | 12/2011 | Rossi et al. |
| 2012/0025766 A1* | 2/2012 | Reade ............... G06F 1/3212 320/110 |
| 2012/0043937 A1 | 2/2012 | Williams |
| 2012/0045929 A1 | 2/2012 | Streeter et al. |
| 2012/0060261 A1 | 3/2012 | Raviv |
| 2012/0094166 A1 | 4/2012 | Lee et al. |
| 2012/0100414 A1 | 4/2012 | Sonta |
| 2012/0114990 A1 | 5/2012 | Jeong et al. |
| 2012/0156911 A1* | 6/2012 | Smith ............... H01R 13/622 439/323 |
| 2012/0186000 A1 | 7/2012 | Raviv |
| 2012/0227792 A1 | 9/2012 | Chen et al. |
| 2012/0240999 A1 | 9/2012 | Yoshida et al. |
| 2013/0034765 A1 | 2/2013 | Kowalski |
| 2013/0049991 A1 | 2/2013 | Mothaffar |
| 2013/0084473 A1 | 4/2013 | Wahlquist et al. |
| 2013/0089756 A1 | 4/2013 | Kwag |
| 2013/0164567 A1 | 6/2013 | Olsson et al. |
| 2013/0181666 A1 | 7/2013 | Matthias et al. |
| 2013/0263922 A1 | 10/2013 | Jung et al. |
| 2013/0294712 A1 | 11/2013 | Seuk |
| 2014/0072864 A1 | 3/2014 | Suzuta et al. |
| 2014/0082814 A1 | 3/2014 | Rober et al. |
| 2014/0095915 A1 | 4/2014 | Hitchcock et al. |
| 2014/0101831 A1 | 4/2014 | Balzano |
| 2014/0142507 A1 | 5/2014 | Armes |
| 2014/0206976 A1 | 7/2014 | Thompson et al. |
| 2014/0210399 A1 | 7/2014 | Urschel et al. |
| 2015/0086868 A1 | 3/2015 | Inoue et al. |
| 2015/0114444 A1 | 4/2015 | Lentine et al. |
| 2015/0114451 A1 | 4/2015 | Anderson et al. |
| 2015/0118543 A1 | 4/2015 | Kim et al. |
| 2015/0128845 A1 | 5/2015 | Desaulniers |
| 2015/0200318 A1 | 7/2015 | Thiel |
| 2015/0216245 A1 | 8/2015 | Kinsley |
| 2015/0216274 A1 | 8/2015 | Akin et al. |
| 2015/0263377 A1 | 9/2015 | Brooks et al. |
| 2015/0295617 A1 | 10/2015 | Lai et al. |
| 2016/0112004 A1 | 4/2016 | Thiel et al. |
| 2016/0118634 A1 | 4/2016 | Thiel et al. |
| 2016/0183394 A1 | 6/2016 | Raschilla et al. |
| 2016/0360146 A1 | 12/2016 | Smith |
| 2017/0045337 A1 | 2/2017 | Kim |
| 2017/0110896 A1 | 4/2017 | Gissin et al. |
| 2017/0229692 A1 | 8/2017 | Thiel et al. |
| 2017/0245567 A1 | 8/2017 | Fathollahi et al. |
| 2017/0259956 A1* | 9/2017 | Hori ............... A45C 13/02 |
| 2017/0280797 A1 | 10/2017 | Bayliss |
| 2018/0053919 A1 | 2/2018 | Thiel et al. |
| 2018/0062197 A1 | 3/2018 | Thiel et al. |
| 2018/0102518 A1 | 4/2018 | Thiel et al. |
| 2018/0102656 A1 | 4/2018 | Thiel et al. |
| 2018/0145445 A1 | 5/2018 | Louis et al. |
| 2018/0168065 A1 | 6/2018 | Thiel et al. |
| 2018/0249133 A1 | 8/2018 | Thiel et al. |
| 2018/0258882 A1 | 9/2018 | Thiel et al. |
| 2019/0081493 A1 | 3/2019 | Thiel et al. |
| 2019/0109349 A1 | 4/2019 | Thiel et al. |
| 2019/0133303 A1 | 5/2019 | Thiel et al. |
| 2020/0187379 A1 | 6/2020 | Thiel et al. |
| 2020/0288089 A1 | 9/2020 | Thiel et al. |
| 2021/0005850 A1 | 1/2021 | Thiel et al. |

FOREIGN PATENT DOCUMENTS

| | | |
|---|---|---|
| JP | 2002325339 A | 11/2002 |
| JP | 2003174179 A | 6/2003 |
| JP | 2004103248 A | 4/2004 |
| KR | 101145898 B1 | 5/2012 |
| KR | 101159750 B1 | 6/2012 |
| KR | 101294972 B1 | 8/2013 |
| WO | 2013106474 A1 | 7/2013 |
| WO | 2015181673 A1 | 12/2015 |
| WO | 2016061508 A1 | 4/2016 |
| WO | 2017040724 A1 | 3/2017 |

OTHER PUBLICATIONS

Electropaedia; Battery and Energy Technologies; printout from Jul. 2, 2012; pp. 1-5 (Year: 2012).

Epsilor; ELI-0414 Rechargeable Li-ion Military Battery; accessed and printed Apr. 21, 2020 (Year: 2020).

Machine translation of JP 2004-103248; accessed and printed Aug. 7, 2021 (Year: 2004).

Rechargeable Military Batteries; Epsilor; https://www.epsilor.com/catalog/Rechargeable/ELI-0414/; accessed and printed May 8, 2020 (Year: 2020).

Yunhuan Group; 3 prong Australia AC power cord; archived Jul. 1, 2016; https://web.archive.org/web/20160701194647/http://www.yunhuanelectric.com/Australia-AC-Power-Cord-03.html (Year: 2016).

Machine translation of JP 2002-325339A, Okada Tadao, 2002 (Year: 2002).

Machine translation of CN202931205U, Liu et al., 2013 (Year: 2013).

\* cited by examiner (PLAN-A)

(PLAN-B)

(SIDE)

(END-A)

(END-B)

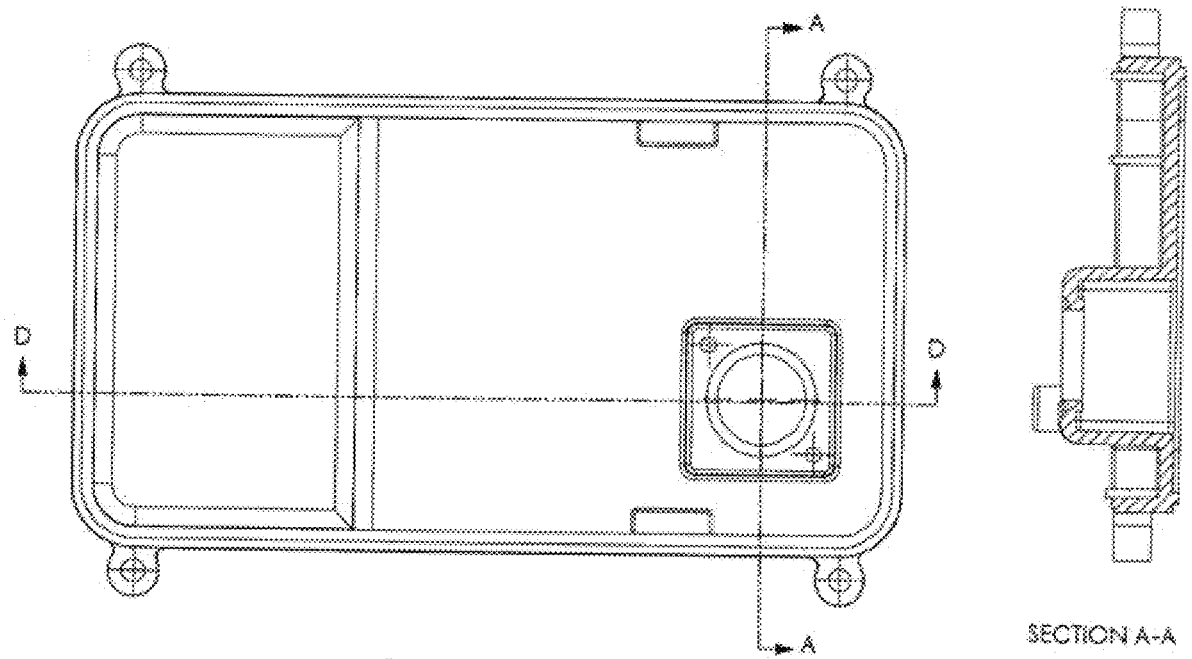
FIG. 18A
SECTION A-A
FIG. 18B
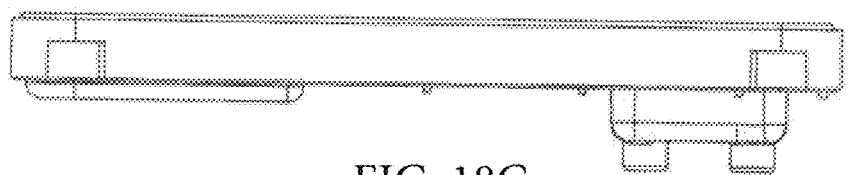
FIG. 18C
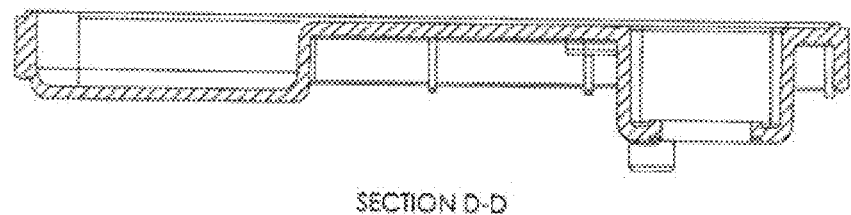
SECTION D-D
FIG. 18D

SECTION A-A

DETAIL B
SCALE 2:1

SECTION C-C

MATERIAL FOR DISSIPATING HEAT FROM AND/OR REDUCING HEAT SIGNATURE OF ELECTRONIC DEVICES AND CLOTHING

CROSS REFERENCE TO RELATED APPLICATIONS

This application is related to and claims priority from the following U.S. patent applications. This application is a continuation of U.S. application Ser. No. 15/470,382, filed Mar. 27, 2017, which is a continuation-in-part of U.S. application Ser. No. 14/516,127, filed Oct. 16, 2014. Each of the above listed applications is incorporated herein by reference in its entirety.

BACKGROUND OF THE INVENTION

1. Field of the Invention

The presently invention relates generally to systems and methods of dissipating heat, shielding objects from external heat and/or managing heat signatures of objects, including a material for dissipating heat from and/or reducing the heat signature of electronic devices and/or clothing.

2. Description of the Prior Art

The military uses various types of portable electronic devices, such as portable battery-operated radios, which generate heat during operation, i.e., during normal operation, the devices may be heat-generating devices. In particular, a malfunctioning device can cause excessive heating. A drawback of heat-generating devices is that the heat may be transferred to the person using or carrying the device, causing uncomfortableness or burns. Another drawback of heat-generating devices is that the heat may be transferred to other devices, causing damage to these devices. Further, in military applications, heat-generating devices may increase the heat signature of military personnel, making them more prone to detection by thermal imaging and therefore more prone to danger.

It is known in the prior art to provide heat dissipating material or insulating material with heat-generating devices.

Representative prior art patent documents include the following:

US Publication No. 20110100425 for heat dissipation sheet for the back face of solar battery module, and solar battery module using the same by inventors Osamura et al., filed Nov. 1, 2010 and published May 5, 2011, is directed to a heat dissipation sheet for the back face of a solar battery module includes a heat dissipation film, and an adhesive compound layer laminated on one face side of the heat dissipation film. The heat dissipation film preferably has a fine bumpy shape on the entire surface of another face. The heat dissipation film preferably includes a substrate layer in which the adhesive compound layer is laminated on one face side, and a heat dissipation layer laminated on another face side of the substrate layer. The heat dissipation layer preferably includes fine particles, and a binder for the fine particles.

US Publication No. 20130263922 for back sheet for solar cells and method for preparing the same by inventors Jung et al., filed Dec. 28, 2011 and published Oct. 10, 2013, is directed to a back sheet for solar cells including a substrate, a fluororesin layer existing on one side of the substrate and a heat-dissipating ink layer existing on the other side of the substrate. Provided also is a method for preparing the same. The back sheet for solar cells may have an excellent heat dissipation property as well as a high durability. Further, the method for preparing the same may allow a cost-efficient production of solar cells.

US Publication No. 20080223428 for all printed solar cell array by inventor Zeira, filed Dec. 7, 2005 and published Sep. 18, 2008, is directed to a method for producing a photovoltaic novelty item. Conductive polymer solutions and semiconductive oxide dispersions are formulated into inks that are laid down on top of one another to produce voltage and current when exposed to light. In addition, these inks may be printed on novelty items, such as magazine advertisements or greeting cards, connecting to printed light emitting graphics.

US Publication No. 20080223431 for foldable solar panel by inventor Chu, filed Mar. 15, 2007 and published Sep. 18, 2008, is directed to a foldable solar panel comprising multiple rigid cell assemblies, multiple folding cell assemblies and multiple primary flexible seams. Each folding cell assembly has two symmetric folding cell assembly halves and a flexible secondary seam. The symmetric folding cell assembly halves are adjacent to each other. The secondary flexible seam connects adjacent symmetric folding cell assembly halves and allows them to fold inward onto each other. A primary flexible seam connects a rigid cell assembly to an adjacent folding cell assembly to form an absorbing surface. The primary flexible seams and secondary flexible seams facilitate folding the foldable solar penal to a small volume to facilitate transportation or storage, and effectively keep the absorbing surface from being damaged.

US Publication No. 20090229655 for solar cell by inventor Lee, filed Mar. 13, 2008 and published Sep. 17, 2009, is directed to a solar cell. The solar cell defines a receiving room in where at least a cell unit is located. A transparent cover plate is placed over the cell unit. In addition, the transparent cover plate includes a base plate and a structured plate which are adhered to each other. Wherein, the base plate is made from inflexible material and the structured plate is made from a photo resin. Moreover, there are pluralities of convex first patterns disposed on the incident surface of the structured plate.

SUMMARY OF TIE INVENTION

The present invention provides systems, methods and articles having a heat-shielding or blocking, heat-dissipating and/or heat signature-reducing material layer or coating for functionally protecting articles, electronic devices, batteries disposed within a housing, and human skin in contact with heat-producing objects. The term "housing" as used throughout this application refers to an apparatus which holds casing-enclosed batteries (i.e. one or more sealed individual batteries). In one example, the heat-shielding or blocking, heat-dissipating and/or heat signature-reducing material completely covers the interior of a housing having a plurality of battery cells removably disposed therein. Other examples include a heat-shielding or blocking, heat-dissipating and/or heat signature-reducing material layer having anti-static, anti-radio frequency (RF), anti-electromagnetic interference (EMI), anti-tarnish, and/or anti-corrosion materials and properties that effectively protect battery-operated devices and/or the batteries that power them from damage or diminished operation.

In one embodiment, a housing with sealed battery cells disposed therein is coated or lined with a heat-shielding or blocking, heat-dissipating and/or heat signature-reducing material. Preferably, the heat-shielding or blocking, heat-dissipating and/or heat signature-reducing material completely covers the interior of a housing having a plurality of battery cells removably disposed therein. Other examples include a heat-shielding or blocking, heat-dissipating and/or heat signature-reducing material layer having anti-static, anti-radio frequency (RF), anti-electromagnetic interference (EMI), anti-tarnish, and/or anti-corrosion materials and properties that effectively protect battery-operated devices and/or the batteries that power them from damage or diminished operation.

In another embodiment, the present invention provides an article for dissipating heat including a heat-dissipating layer; and one or more substrates disposed in close relation to the heat-dissipating layer. One aspect of the present invention provides a heat-dissipating layer including one or more of a material selected from the group including an anti-static material, an anti-radio frequency material, an anti-electromagnetic interference material, an anti-corrosion material, or an anti-tarnish material. Another aspect of the present invention provides a heat-dissipating layer that includes a copper shielding plastic or a copper impregnated polymer.

In one embodiment of systems, methods, and articles of the present invention, a heat-dissipating material layer is uniformly distributed as a coating and/or lining on the internal sides of a housing for battery components for functionally shielding the batteries disposed in the housing from external heat, dissipating heat produced by the batteries disposed in the housing and reducing the heat signature associated therewith.

These and other aspects of the present invention will become apparent to those skilled in the art after a reading of the following description of the preferred embodiment when considered with the drawings, as they support the claimed invention.

BRIEF DESCRIPTION OF THE DRAWINGS

FIG. 18A illustrates a top view perspective of the battery lid.

FIG. 18B illustrates a cross-section view of the battery lid.

FIG. 18C illustrates a side view perspective of the battery lid.

FIG. 18D illustrates another cross-section view of the battery lid.

DETAILED DESCRIPTION

Figure 1A:
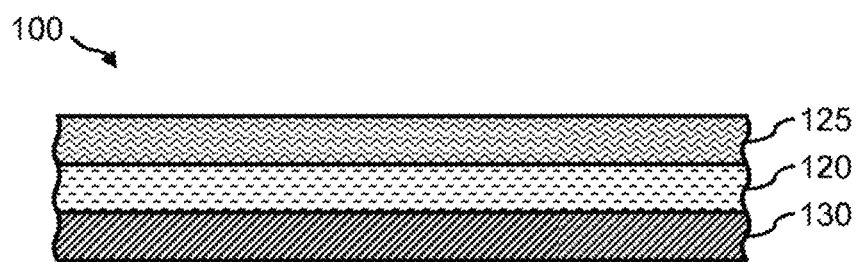
FIG. 1A illustrates a cross-sectional view of one embodiment of structures that include material for dissipating heat from and/or reducing heat signature of electronic devices and/or clothing.

The present invention provides systems, methods and articles having a heat-shielding or blocking, heat-dissipating and/or heat signature-reducing material layer or coating that functions to protect electronic devices, articles, and/or human skin in contact with them. In one example, the heat-shielding or blocking, heat-dissipating and/or heat signature-reducing material completely covers the interior of a housing having a plurality of battery cells removably disposed therein. Other examples include a heat-shielding or blocking, heat-dissipating and/or heat signature-reducing material layer having anti-static, anti-radio frequency (RF), anti-electromagnetic interference (EMI), anti-tarnish, and/or anti-corrosion materials and properties that effectively protect battery-operated devices and/or the batteries that power them from damage or diminished operation In one embodiment of the present invention, the heat-dissipating layer includes one or more of a material selected from the group consisting of an anti-static material, an anti-radio frequency material, an anti-electromagnetic interference material, an anti-corrosion material, an anti-tarnish material, and combinations thereof. Preferably, the heat dissipating material layer or coating includes a copper shielding plastic, and more preferably, the heat dissipating material layer or coating includes a copper impregnated polymer.

In alternate embodiments, one substrate is bonded to the heat-dissipating layer; one substrate is loosely arranged in relation to the heat-dissipating layer; a first substrate and a second substrate wherein the heat-dissipating layer is sandwiched between the first and second substrate, or the first and second substrates are bonded to the heat-dissipating layer, or the first and second substrates are loosely arranged in relation to the heat-dissipating layer, or the first substrate is bonded to the heat-dissipating layer and the second substrate is loosely arranged in relation to the heat-dissipating layer. In these various embodiments, the one or more substrates are flexible, rigid, or a combination thereof; the one or more substrates include a fabric; the one or more substrates include one or more of glass, plastic, or metal; or the one or more substrates are multi-layer structures.

In one embodiment of the present invention, the article including a heat-dissipating material layer is configured to fit inside a hand-held radio holder. In yet another embodiment, the article includes a solar panel assembly sandwiched between a first substrate and the heat-dissipating layer.

In an exemplary embodiment, the heat shielding or blocking, or heat-dissipating material is used to prevent and/or minimize heat transfer and the heat signature produced from batteries, as well as to prevent and/or minimize heat transfer from external heat-producing articles or objects. Team operations in remote locations, such as military operations, require radios to allow team members to communicate about danger, injuries, opportunities, etc. Without radios in these environments, more people would be injured or die. However, most radios suitable for these environments are high powered radios which typically require lithium ion batteries. While lithium ion batteries are capable of providing a lot of power, lithium ion batteries have produced a large amount of heat since their inception. The heat produced from lithium ion batteries is capable of causing radiation burns to radio operators, even through layers of clothing. This heat also increases the heat signature of soldiers, making them more vulnerable to enemy thermal imaging technology. In extreme cases, malfunctions in lithium ion batteries cause fires. Heat produced from lithium ion batteries is also capable of damage the radio itself or other electronic devices critical to survival.

Additionally, shipping lithium ion batteries or devices with lithium ion batteries is banned or highly regulated in most parts of the world due to the risk of overheating and/or fire. What is needed is a material which is operable to be incorporated within a battery housing with lithium batteries, but not on the batteries themselves, to prevent the risk of overheating and fire. As lithium ion batteries were developed in the 1970s and have been in commercial use since the 1990s, there is a long-felt unmet need for systems, methods, and apparatuses to reduce, eliminate, or contain the heat produced from batteries for safer operation of radios and other electronic devices critical to survival.

None of the prior art provides a housing, base, container, or case for one or more batteries which dissipates the heat produced by the one or more batteries during operation, thus reducing the heat signature of the housing and preventing the housing from heating and causing discomfort and/or burns to an operator in contact with the housing.

Certain aspects of the presently disclosed subject matter of the invention, having been stated hereinabove, are addressed in whole or in part by the presently disclosed subject matter, and other aspects will become evident as the description proceeds when taken in connection with the accompanying illustrative examples and figures as best described herein below.

Referring now to the drawings in general, the illustrations are for the purpose of describing a preferred embodiment of the invention and are not intended to limit the invention thereto.

The present invention provides a material for 1) reducing or eliminating heat exposure from external objects or other heat-producing devices; 2) dissipating heat from at least one battery or heat-producing electronic device; and/or 3) reducing the heat signature of electronic devices and/or clothing. The heat blocking or shielding, heat-dissipating, and/or heat signature-reducing material is incorporated into the housing of a heat-producing device or battery pack housing, or any article of clothing or fabric. In one example, a heat shielding or blocking, heat-dissipating, and/or heat signature-reducing material layer is sandwiched between two substrates, wherein the substrates are operable to be flexible, rigid, or a combination of both flexible and rigid.

When applied to clothing, the heat blocking or shielding, heat-dissipating, and/or heat signature-reducing material is operable to protect a person's skin from burns from a heat-generating article or source. Surprisingly, one embodiment of the heat blocking or shielding, heat-dissipating and/or heat signature-reducing material layer was discovered when it was in a person's hand but they were not burned by a heat gun when holding the material in hand, between the heat gun and skin. It was later tested and proved completely heat-resistant, heat-shielding, and/or heat-dissipating up to temperatures of heat guns (up to about 1,000 degrees Fahrenheit), propane torches (up to about 3,623 degrees Fahrenheit), and oxygen-fed torches (up to about 5,110 degrees Fahrenheit). These surprising test results combined with other trials generated the embodiments of the present invention and the particular examples that are described herein, in particular for linings or coatings that are constructed and configured especially for heat blocking or shielding, heat-dissipating and/or heat signature-reducing material layer or coating applied to objects for protecting an article from any external heat source, as well as dissipating heat produced by heat-producing devices and their batteries.

Figure 1B:
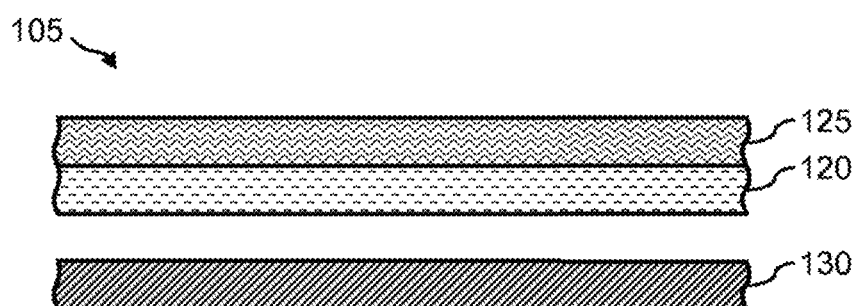
FIG. 1B illustrates a cross-sectional view of another embodiment of structures that include material for dissipating heat from and/or reducing heat signature of electronic devices and/or clothing.

FIG. 1A and FIG. 1B are cross-sectional views of examples of structures that include the material for dissipating heat from and/or reducing heat signature of electronic devices and/or clothing. The heat-dissipating and/or heat signature-reducing material is operable to be used in combination with, for example, one or two substrates. For example, FIG. 1A shows a structure 100 that includes a heat-dissipating and/or heat signature-reducing layer 120. The heat-dissipating and/or heat signature-reducing layer 120 is operable to be sandwiched between a first substrate 125 and a second substrate 130.

The heat-dissipating and/or heat signature-reducing layer 120 is operable to be any material that is suitable for dissipating heat from and/or reducing the heat signature of electronic devices and/or clothing. The heat-dissipating and/or heat signature-reducing layer 120 is operable to be from about 20 μm thick to about 350 μm thick in one example. In particular embodiments, the heat-dissipating and/or heat signature-reducing layer 120 is operable to have a thickness ranging from about 1 mil to about 6 mil, including, but not limited to, 1, 2, 3, 4, 5, and 6 mil, or about 25 μm to about 150 μm, including, but not limited to, 25, 50, 75, 100, 125, and 150 μm. Examples of the heat-dissipating and/or heat signature-reducing layer 120 include anti-static, anti-radio frequency (RF), and/or anti-electromagnetic interference (EMI) materials, such as copper shielding plastic or copper particles bonded in a polymer matrix, as well as anti-tarnish and anti-corrosion materials. A specific example of the heat-dissipating and/or heat signature-reducing layer 120 is the anti-corrosive material used in Corrosion Intercept Pouches, catalog number 034-2024-10, available from University Products Inc. (Holyoke, Mass.). The anti-corrosive material is described in U.S. Pat. No. 4,944,916 to Franey, which is incorporated by reference in its entirety. Such materials are operable to include copper shielded or copper impregnated polymers including, but not limited to, polyethylene, low-density polyethylene, high-density polyethylene, polypropylene, and polystyrene. In another embodiment, the heat shielding or blocking, heat-dissipating, and/or heat signature-reducing layer is a polymer with aluminum and/or copper particles incorporated therein. In particular, the surface area of the polymer with aluminum and/or copper particles incorporated therein preferably includes a large percent by area of copper and/or aluminum. By way of example and not limitation, the surface area of the heat-dissipating and/or heat signature-reducing layer includes about 25% by area copper and/or aluminum, 50% by area copper and/or aluminum, 75% by area copper and/or aluminum, or 90% by area copper and/or aluminum. In one embodiment, the heat shielding or blocking, heat-dissipating, and/or heat signature-reducing layer is substantially smooth and not bumpy. In another embodiment, the heat shielding or blocking, heat-dissipating, and/or heat signature-reducing layer is not flat but includes folds and/or bumps to increase the surface area of the layer. Alternatively, the heat-shielding or blocking, heat-dissipating and/or heat signature-reducing layer 120 includes a fabric having at least one metal incorporated therein or thereon. The fabric further includes a synthetic component, such as by way of example and not limitation, a nylon, a polyester, or an acetate component. Preferably, the at least one metal is selected from the group consisting of copper, nickel, aluminum, gold, silver, tin, zinc, or tungsten.

The first substrate 125 and the second substrate 130 are operable to be any flexible or rigid substrate material. An example of a flexible substrate is any type of fabric. Examples of rigid substrates include, but are not limited to, glass, plastic, and metal. A rigid substrate is operable to be, for example, the housing of any device. In one example, both the first substrate 125 and the second substrate 130 are flexible substrates. In another example, both the first substrate 125 and the second substrate 130 are rigid substrates. In yet another example, the first substrate 125 is a flexible substrate and the second substrate 130 is a rigid substrate. In still another example, the first substrate 125 is a rigid substrate and the second substrate 130 is a flexible substrate. Further, the first substrate 125 and the second substrate 130 are operable to be single-layer or multi-layer structures.

Figure 1C:
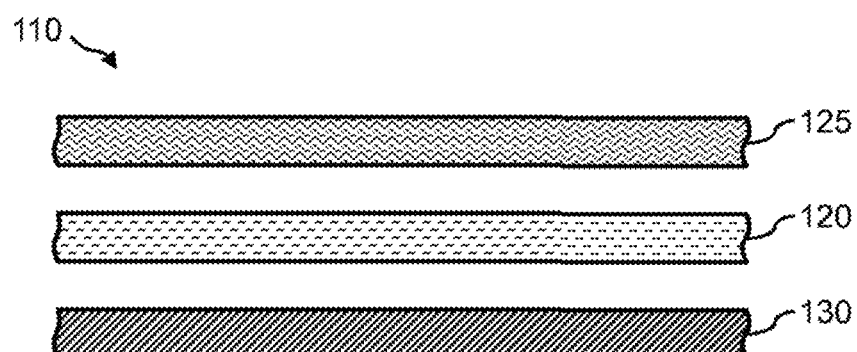
FIG. 1C illustrates a cross-sectional view of yet another embodiment of structures that include material for dissipating heat from and/or reducing heat signature of electronic devices and/or clothing.
Figure 1D:
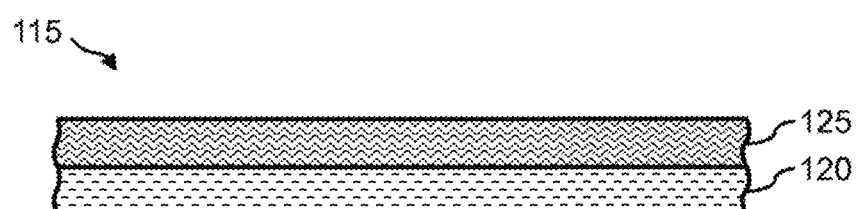
FIG. 1D illustrates a cross-sectional view of yet another embodiment of structures that include material for dissipating heat from and/or reducing heat signature of electronic devices and/or clothing.

In structure 100 of FIG. 1A, the heat-shielding or blocking, heat-dissipating and/or heat signature-reducing layer 120, the first substrate 125, and the second substrate 130 are bonded or otherwise attached together, by way of example and not limitation, by adhesive, stitching, hook-and-loop fastener system). In another example and referring now to FIG. 1B, in a structure 105, the first substrate 125 is bonded to one side of the heat shielding or blocking, heat-dissipating, and/or heat signature-reducing layer 120, whereas the second substrate 130 is not bonded or otherwise attached to the other side of the heat shielding or blocking, heat-dissipating, and/or heat signature-reducing layer 120. In yet another example and referring now to FIG. 1C, in a structure 110, the first substrate 125 is provided loosely against one side of the heat shielding or blocking, heat-dissipating, and/or heat signature-reducing layer 120 and the second substrate 130 is provided loosely against the other side of the heat-dissipating and/or heat signature-reducing layer 120. The first substrate 125 and the second substrate 130 are not bonded or otherwise attached to the heat shielding or blocking, heat-dissipating, and/or heat signature-reducing layer 120. In still another example and referring now to FIG. 1D, in a structure 115, the heat shielding or blocking, heat-dissipating, and/or heat signature-reducing layer 120 is provided in combination with the first substrate 125 only, either bonded or loosely arranged. In FIG. 1D, if the two layers are loosely arranged, the heat-dissipating and/or heat signature-reducing layer 120 is not bonded or otherwise attached to the first substrate 125. The presently disclosed material is not limited to the structures 100, 105, 110, 115. These structures are exemplary only.

The heat-shielding or blocking, heat-dissipating and/or heat signature-reducing layer 120 is operable to be used as a protective shield against heated objects and also for reducing the heat signature of objects. For example, in military applications, the heat shielding or blocking, heat-dissipating, and/or heat signature-reducing layer 120 is operable to be used to reduce the heat signature of devices or clothing for military personnel to reduce the risk of their being detected by thermal imaging.

Other examples of applications and/or uses of the heat-shielding or blocking, heat-dissipating and/or heat signature-reducing layer 120 include, but are not limited to, insulating battery packs, for example in any battery housing or electronic device housing; protecting device and/or users from undesirable external heat; forming sandwich structures; form fitting to a particular device; enclosing electronic materials to prevent corrosion or feathering; medical applications to protect patients from heated devices used in surgical procedures, for example, in robotics (e.g., for use in disposable, sterile drapes); forming solar panels; lining tents (e.g., to prevent heat from going in or out); forming heat shields or guards for mufflers on, for example, motorcycles, lawn mowers, leaf blowers, or weed eaters; lining gloves to protect from flames, handling ice, and/or for preparing food (including pastry preparation).

Other examples of protective flexible heat shielding applications in which the heat-dissipating and/or heat signature-reducing layer 120 are operable to be used include gloves (e.g., fire pit gloves, gloves/forearm shields for operating two-stroke engine yard equipment), integrated in uniforms (e.g., nurses/scrub technicians in operating rooms vs. electro cautery), motorcyclist (clothing) protection from tail pipes, protective shielding in radio pouches (e.g., protecting person from radio heat, protecting radio from heating battery, protecting battery from heating radio, protecting battery from external heat sources), protection on the bottom of a laptop (inside the laptop housing), protection layer from heat of laptop for laps (e.g., lap tray) and expensive furniture (e.g., furniture pad), and portable protective heat shield (e.g., protect sensitive electronics and persons, varies in sizes).

Figure 2A:
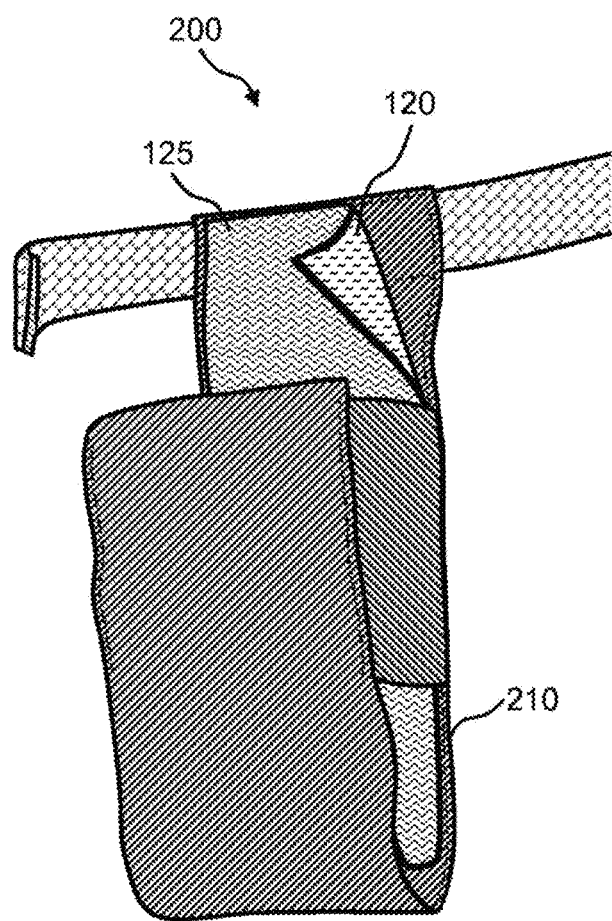
FIG. 2A is a view of a radio holder article held in a pouch.

FIG. 2A is a perspective view of a radio holder article 200 into which the heat-shielding or blocking, heat-dissipating and/or heat signature-reducing layer 120 is installed. The radio holder article 200 is an example of equipment that is operable to be used by military personnel. The radio holder article 200 is but one example of using the heat-shielding or blocking, heat-dissipating and/or heat signature-reducing layer 120 for dissipating heat from and/or reducing the heat signature of an article. Military radios often get hot and are operable to cause burns to the user.

Figure 2B:
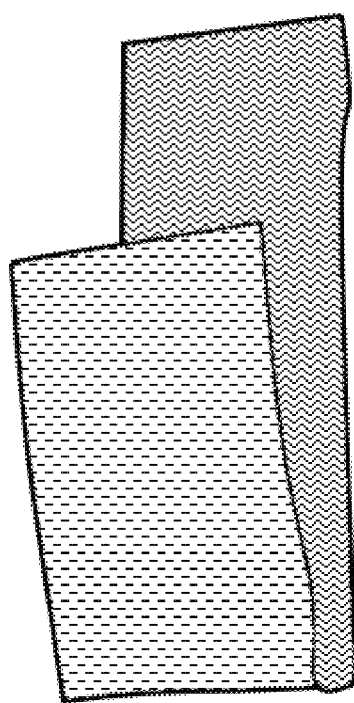
FIG. 2B is a view of the radio holder article of FIG. 2A removed from the pouch.

The radio holder article 200 is operable to be removably held in a pouch 210 and worn on a user's belt 230. FIG. 2B is a view of the radio holder article 200 removed from the pouch 210. In this example, a structure, such as the structure 115 of FIG. 1D, is formed separately and then inserted into the pouch 210 of the radio holder article 200. In another example, in the case of the structure 105 of FIG. 1B, the radio holder article 200 itself serves as the second substrate 130. This allows the radio holder article 200 to be easily removed from the pouch 210. It also provides for retrofitting the pouch with heat protection from the heat-shielding or blocking, heat-dissipating and/or heat signature-reducing material layer or coating.

Alternatively, the radio holder article 200 is permanently held in the pouch 210. The pouch 210 is formed using a structure, such as the structure 100 of FIG. 1A. The pouch 210 includes a pouch attachment ladder system (PALS) adapted to attach the pouch to a load-bearing platform (e.g., belt, rucksack, vest). In a preferred embodiment, the pouch 210 is MOLLE-compatible. "MOLLE" means Modular Lightweight Load-carrying Equipment, which is the current generation of load-bearing equipment and backpacks utilized by a number of NATO armed forces.

In this example, the heat-shielding or blocking, heat-dissipating and/or heat signature-reducing layer 120 protects the user from heat from the radio (not shown), the heat shielding or blocking, heat-dissipating, and/or heat signature-reducing layer 120 protects the radio (not shown) from any external heat source (e.g., a hot vehicle), and the heat shielding or blocking, heat-dissipating, and/or heat signature-reducing layer 120 reduces the heat signature of the radio (not shown).

In a preferred embodiment, the substrate 225 is operable to be formed of any flexible, durable, and waterproof or at least water-resistant material. For example, the substrate 225 is operable to be formed of polyester, polyvinyl chloride (PVC)-coated polyester, vinyl-coated polyester, nylon, canvas, PVC-coated canvas, or polycotton canvas. The exterior finish of the substrate 225 is operable to be any color, such as white, brown, or green, or any pattern, such as camouflage, as provided herein, or any other camouflage in use by the military.

Representative camouflages include, but are not limited to, universal camouflage pattern (UCP), also known as ACUPAT or ARPAT or Army Combat Uniform; MultiCam, also known as Operation Enduring Freedom Camouflage Pattern (OCP); Universal Camouflage Patter-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Overwhite Snow digital camouflage, and Tactical Assault Camouflage (TACAM).

Figure 3:
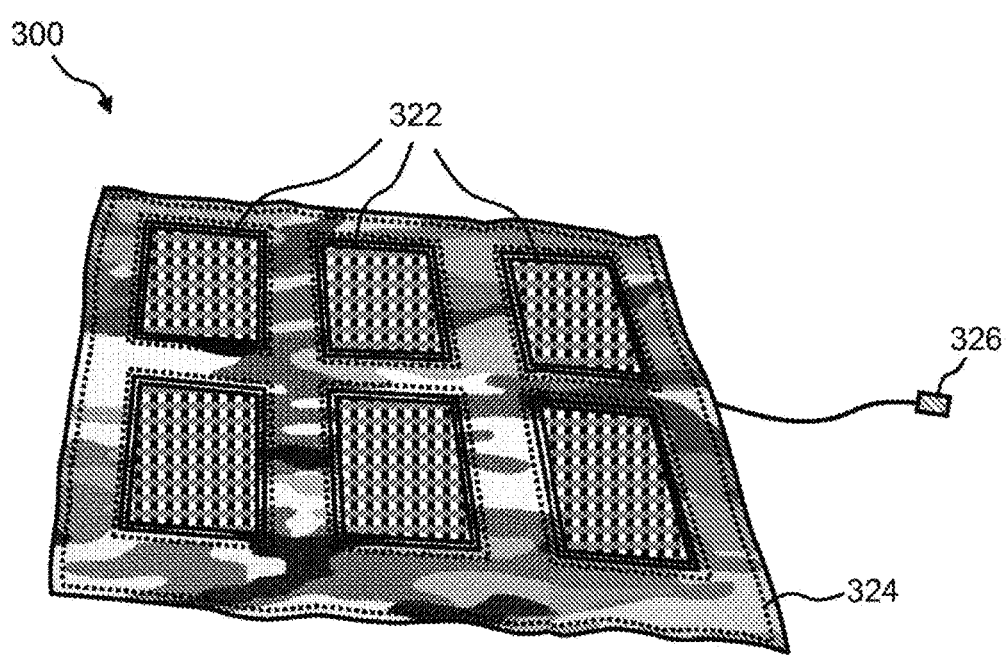
FIG. 3 is a perspective view of an example of a flexible solar panel.
Figure 4:
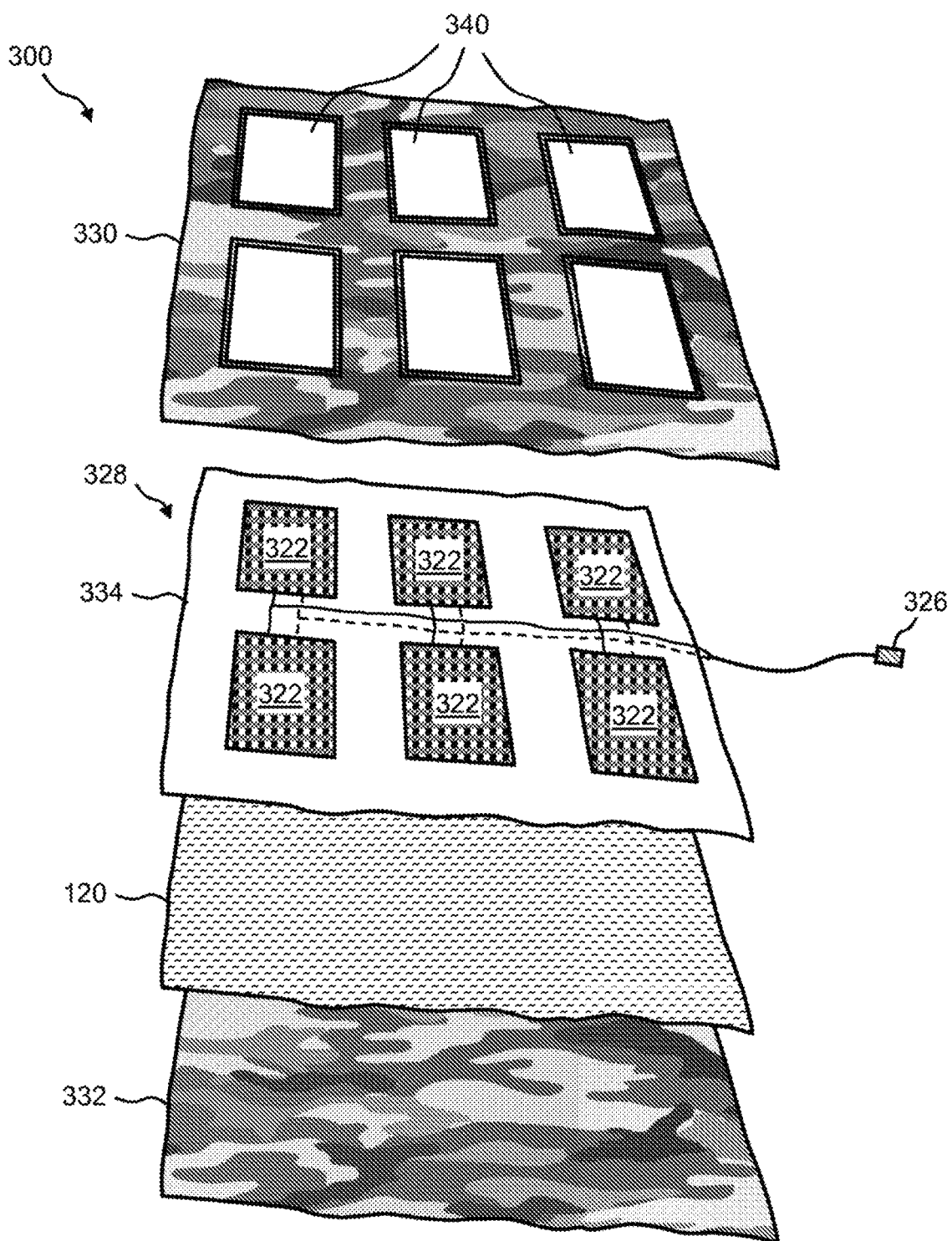
FIG. 4 is an exploded view of an example of a flexible solar panel.

FIG. 3 and FIG. 4 are a perspective view and an exploded view, respectively, of a flexible solar panel article 300 into which the heat-shielding or blocking, heat-dissipating and/or heat signature-reducing layer 120 is installed. The flexible solar panel article 300 is another example of equipment that is operable to be used by military personnel. The flexible solar panel article 300 is but another example of using the heat shielding or blocking, heat-dissipating and/or heat signature-reducing layer 120 for shielding or blocking external heat to, and/or dissipating heat from and/or reducing the heat signature of an article.

In this example, the flexible solar panel article 300 is a flexible solar panel that is operable to be folded up and carried in a backpack and then unfolded and deployed as needed. The flexible solar panel article 300 is used, for example, to charge rechargeable batteries or to power electronic equipment directly.

The flexible solar panel article 300 is a multilayer structure that includes multiple solar modules 322 mounted on a flexible substrate, wherein the flexible substrate with the multiple solar modules 322 is sandwiched between two layers of fabric. Windows are formed in at least one of the two layers of fabric for exposing the solar modules 322.

A hem 324 is operable to be provided around the perimeter of the flexible solar panel article 300. In one example, the flexible solar panel article 300 is about 36×36 inches. The output of any arrangement of solar modules 322 in the flexible solar panel article 300 is a direct current (DC) voltage. Accordingly, the flexible solar panel article 300 includes an output connector 326 that is wired to the arrangement of solar modules 322. The output connector 326 is used for connecting any type of DC load to the flexible solar panel article 300. In one example, the flexible solar panel article 300 is used for supplying power a device, such as a DC-powered radio. In another example, the flexible solar panel article 300 is used for charging a battery.

The flexible solar panel article 300 includes a solar panel assembly 328 that is sandwiched between a first fabric layer 330 and a second fabric layer 332. The first fabric layer 330 and the second fabric layer 332 are operable to be formed of any flexible, durable, and substantially waterproof or at least water-resistant material, such as but not limited to, polyester, PVC-coated polyester, vinyl-coated polyester, nylon, canvas, PVC-coated canvas, and polycotton canvas. The first fabric layer 330 and the second fabric layer 332 are operable to be any color or pattern, such as the camouflage pattern shown in FIG. 3 and FIG. 4.

The solar panel assembly 328 of the flexible solar panel article 300 includes the multiple solar modules 322 mounted on a flexible substrate 334. A set of windows or openings 340 is provided in the first fabric layer 330 for exposing the faces of the solar modules 322. The flexible substrate 334 is formed of a material that is lightweight, flexible (i.e., foldable or rollable), printable, and substantially waterproof or at least water resistant.

In the flexible solar panel article 300, the heat-dissipating and/or heat signature-reducing layer 120 is incorporated into the layers of fabric that form the flexible solar panel article 300, in similar fashion to the structure 100 of FIG. 1A. Namely, the heat-dissipating and/or heat signature-reducing layer 120 is provided at the back of solar modules 322, between the flexible substrate 334 and the second fabric layer 332. In this example, the first fabric layer 330, the flexible substrate 334, the heat-dissipating and/or heat signature-reducing layer 120, and the second fabric layer 332 are held together by stitching and/or by a hook-and-loop fastener system.

In this example, the heat-shielding or blocking, heat-dissipating and/or heat signature-reducing layer 120 protects the user from heat from the back of the flexible solar panel article 300, the heat-shielding or blocking, heat-dissipating and/or heat signature-reducing layer 120 protects the back of the flexible solar panel article 300 from any external heat source (not shown), and the heat-dissipating and/or heat signature-reducing layer 120 reduces the heat signature of the flexible solar panel article 300.

Figure 5:
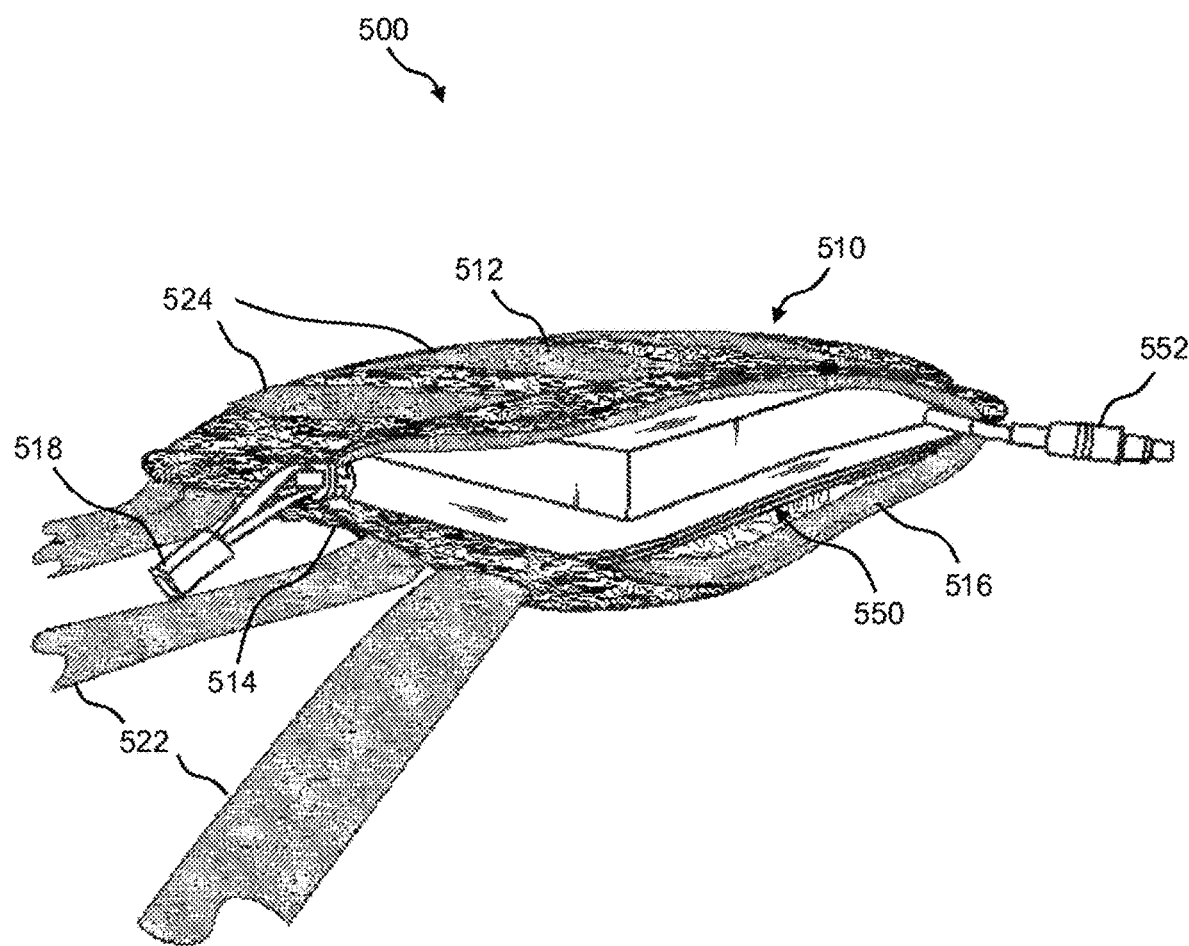
FIG. 5 is a perspective view of an example of a portable battery pack.
Figure 6:
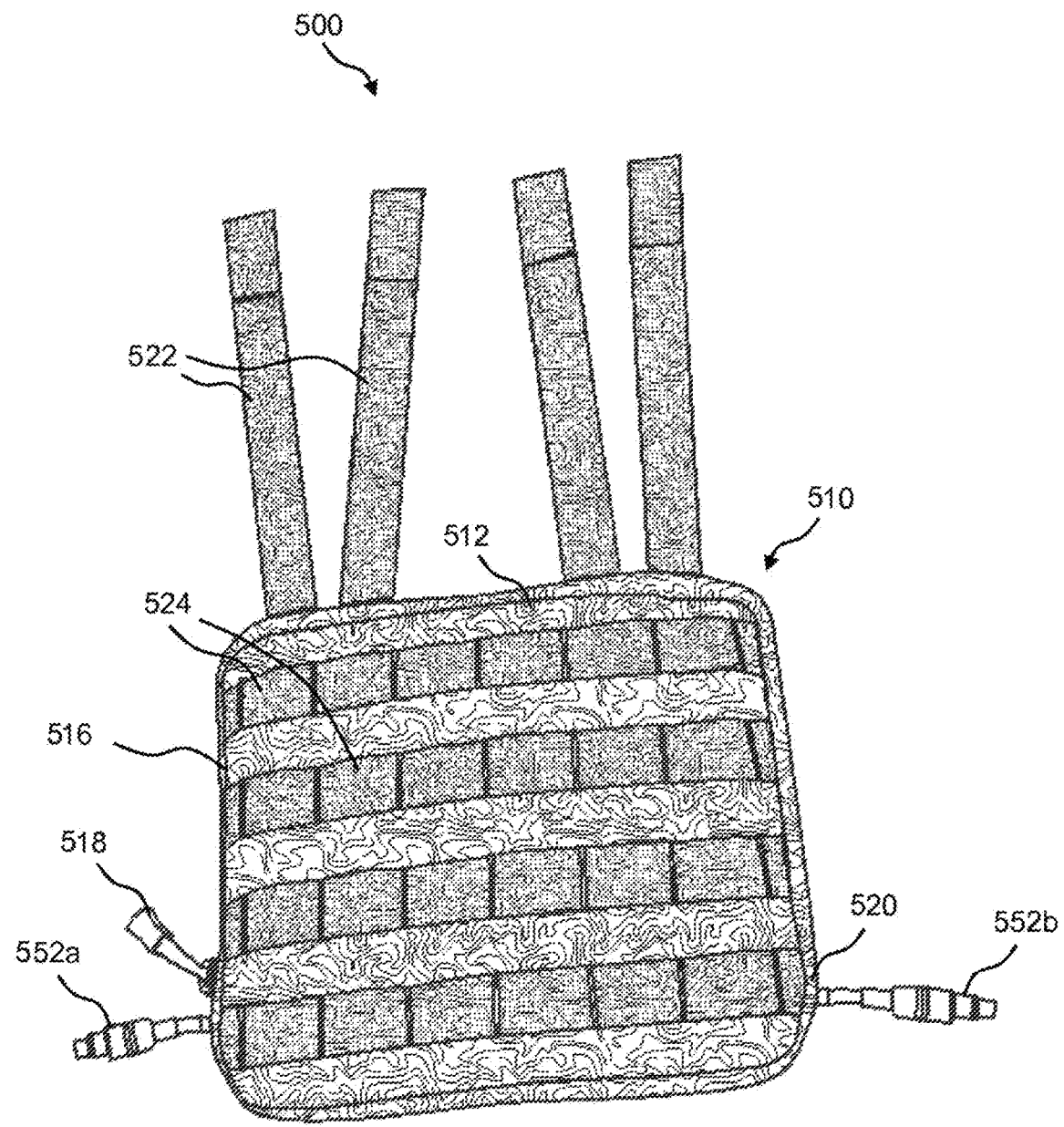
FIG. 6 is another perspective view of an example of a portable battery pack.
Figure 7:
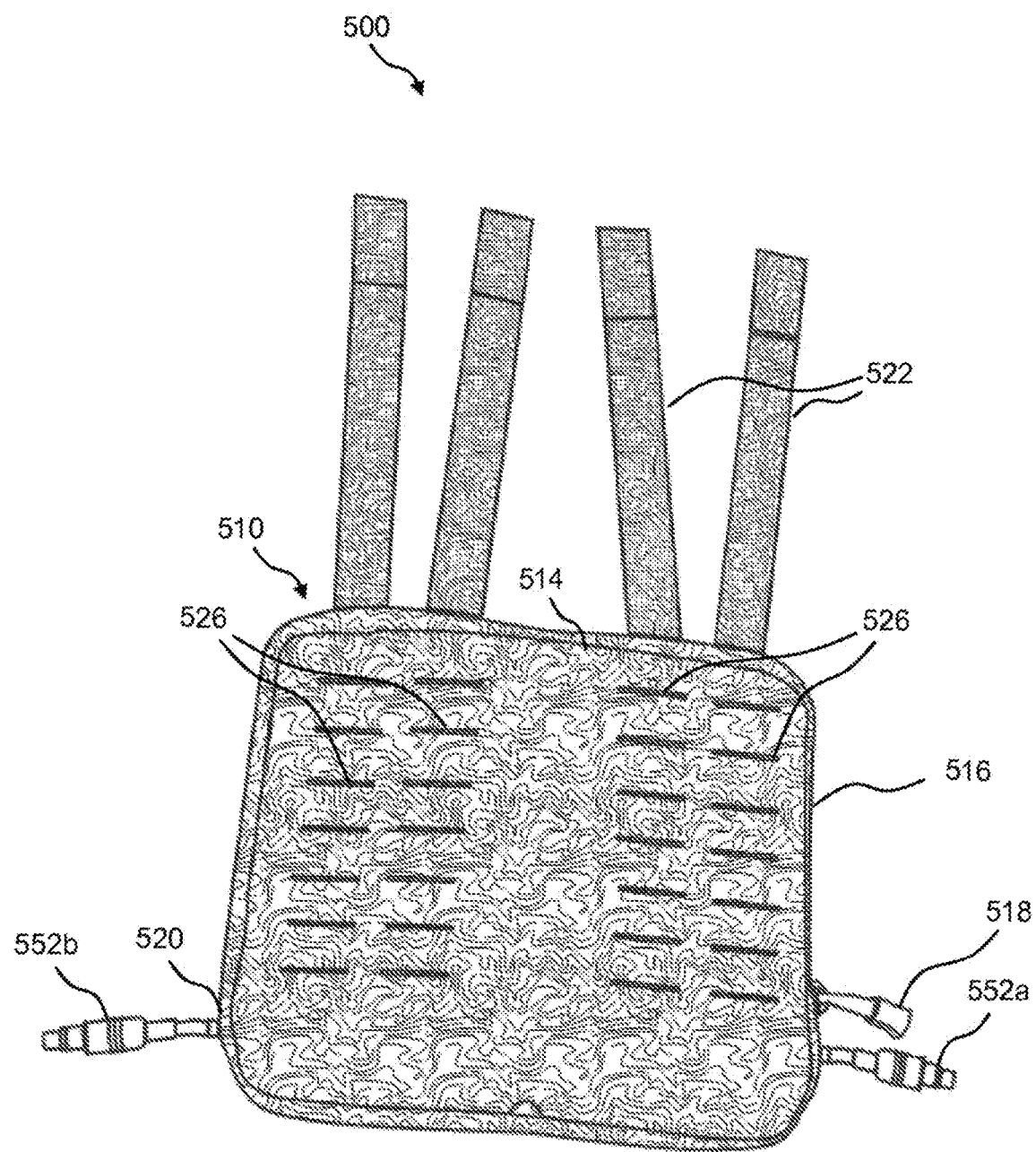
FIG. 7 is yet another perspective view of an example of a portable battery pack.

FIGS. 5-7 are perspective views of a portable battery pack 500 into which the heat dissipating and/or heat signature-reducing material is installed. The portable battery pack 500 is an example of equipment that is operable to be used by military personnel. The portable battery pack 500 is but one example of using the heat-shielding or blocking, heat-dissipating and/or heat signature-reducing layer 120 for dissipating heat from and/or reducing the heat signature of an article. In a preferred embodiment, the portable battery pack includes a portable battery pack such as that disclosed in US Publication No. 20160118634, which is incorporated by reference in its entirety.

Portable battery pack 500 includes a pouch 510 for holding a battery 550. Pouch 510 is a wearable pouch or skin that is operable to be sized in any manner that substantially corresponds to a size of battery 550. In one example, pouch 510 is sized to hold a battery 550 that is about 9.75 inches long, about 8.6 inches wide, and about 1 inch thick.

Pouch 510 is formed of any flexible, durable, and substantially waterproof or at least water resistant material. For example, pouch 510 is operable to be formed of polyester, polyvinyl chloride (PVC)-coated polyester, vinyl-coated polyester, nylon, canvas, PVC-coated canvas, or polycotton canvas. The exterior finish of pouch 510 is operable to be any color, such as white, brown, or green, or any pattern, such as camouflage, as provided herein, or any other camouflage in use by the military. For example, in FIG. 5, FIG. 6, and FIG. 7, pouch 510 is shown to have a camouflage pattern.

Representative camouflages include, but are not limited to, universal camouflage pattern (UCP), also known as ACUPAT or ARPAT or Army Combat Uniform; MultiCam, also known as Operation Enduring Freedom Camouflage Pattern (OCP); Universal Camouflage Patter-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Overwhite Snow digital camouflage, and Tactical Assault Camouflage (TACAM).

Pouch 510 has a first side 512 and a second side 514. Pouch 510 also includes an opening 516, which is the opening through which battery 550 is fitted into pouch 510. In one example, opening 516 is opened and closed using a zipper, as such pouch 510 includes a zipper tab 518. Other mechanisms, however, are operable to be used for holding opening 516 of pouch 510 open or closed, such as, a hook and loop system (e.g., Velcro®), buttons, snaps, hooks, and the like. Further, an opening 520 (see FIG. 6, FIG. 7, FIG. 9) is provided on the end of pouch 510 that is opposite opening 516. For example, opening 520 is operable to be a 0.5-inch long slit or a 0.75-inch long slit in the edge of pouch 510.

In one embodiment, the pouch is a multi-layer structure, such as the structure 100 of FIG. 1A, including at least one layer of the heat-dissipating and/or heat signature-reducing layer. In this embodiment, the heat-dissipating and/or heat signature-reducing layer is permanently attached to the pouch. Alternatively, a structure, such as the structure 115 of FIG. 1D, is formed separately and then inserted into the pouch 510 of the portable battery pack 500. This allows the user to retrofit an existing pouch with heat protection. The retrofit structure includes a structure, such as the structure 115 of FIG. 1D, for protecting the first side 512 and/or the second side 514. The retrofit structure includes a large structure that is operable to wrap around the battery 550 in an alternative embodiment.

In one example, battery 550 is a rechargeable battery that includes two leads 552 (e.g., leads 552a, 552b). Each lead 552 is operable to be used for both the charging function and the power supply function. In other words, leads 552a, 552b are not dedicated to the charging function only or the power supply function only, both leads 552a, 552b is operable to be used for either function at any time. In one example, one lead 552 is operable to be used for charging battery 550 while the other lead 552 is operable to be used simultaneously for powering equipment, or both leads 552 are operable to be used for powering equipment, or both leads 552 are operable to be used for charging battery 550.

With respect to using battery 550 with pouch 510, first the user unzips opening 516, then the user inserts one end of battery 550 that has, for example, lead 552b through opening 516 and into the compartment inside pouch 510. At the same time, the user guides the end of lead 552b through opening 520, which allows the housing of battery 550 to fit entirely inside pouch 510, as shown in FIG. 5. Lead 552a is left protruding out of the unzipped opening 516. Then the user zips opening 516 closed, leaving zipper tab 518 snugged up against lead 552a, as shown in FIG. 6 and FIG. 7. Namely, FIG. 6 shows portable battery pack 500 with side 512 of pouch 510 up, whereas FIG. 7 shows portable battery pack 500 with side 514 of pouch 510 up.

Pouch 510 of portable battery pack 500 is operable to be MOLLE-compatible. "MOLLE" means Modular Lightweight Load-carrying Equipment, which is the current generation of load-bearing equipment and backpacks utilized by a number of NATO armed forces. Namely, pouch 510 incorporates a pouch attachment ladder system (PALS), which is a grid of webbing used to attach smaller equipment onto load-bearing platforms, such as vests and backpacks. For example, the PALS grid consists of horizontal rows of 1-inch (2.5 cm) webbing, spaced about one inch apart, and reattached to the backing at 1.5-inch (3.8 cm) intervals. Accordingly, a set of straps 522 (e.g., four straps 522) are provided on one edge of pouch 510 as shown. Further, four rows of webbing 524 are provided on side 512 of pouch 510, as shown in FIG. 7. Additionally, four rows of slots or slits 526 are provided on side 514 of pouch 510, as shown in FIG. 7.

Figure 8:
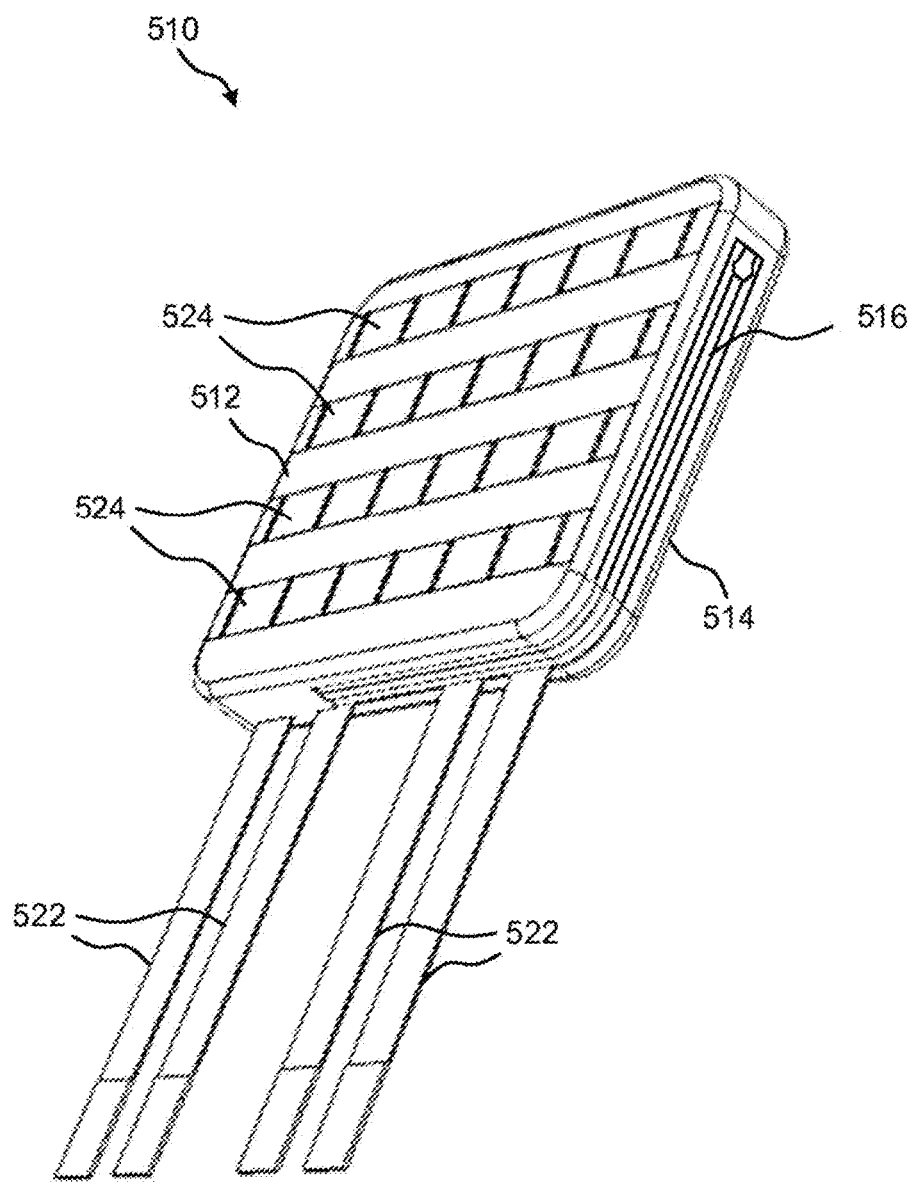
FIG. 8 is a perspective view of an example of a wearable pouch of a portable battery pack.
Figure 9:
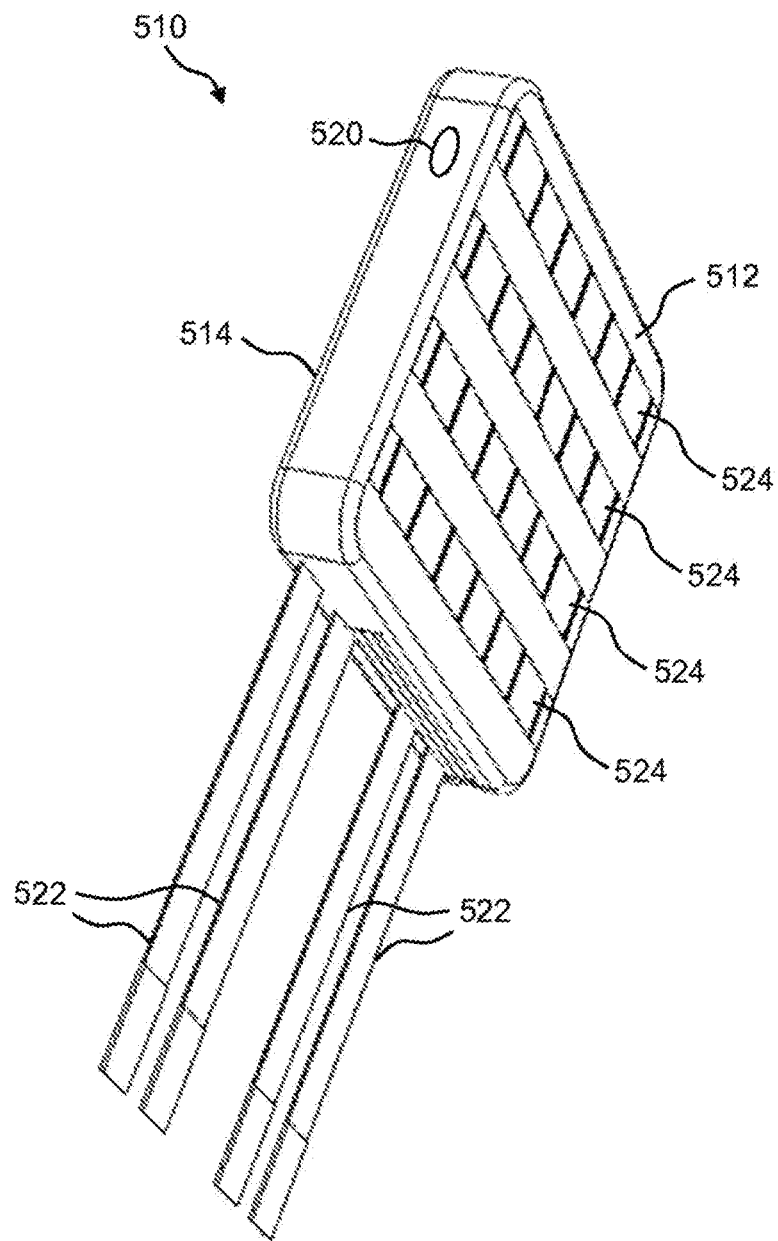
FIG. 9 is another perspective view of an example of a wearable pouch of a portable battery pack.
Figure 10:
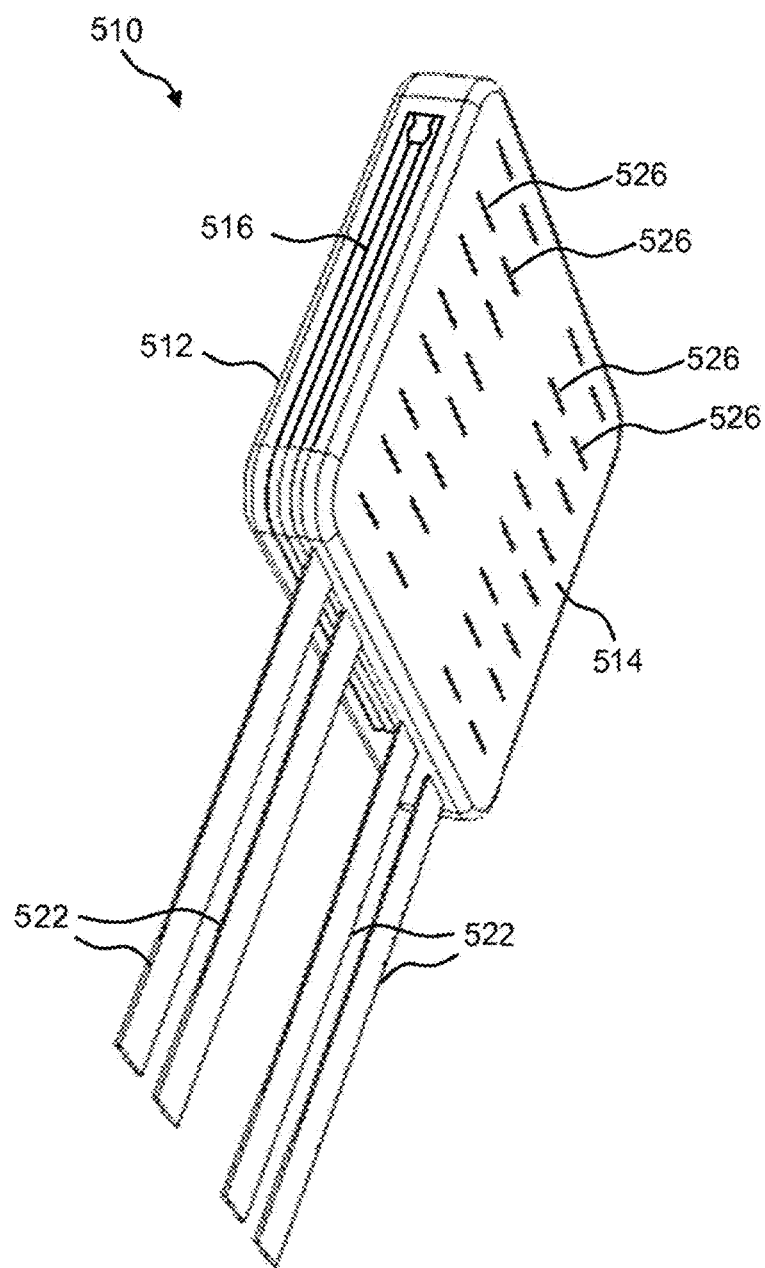
FIG. 10 is yet another perspective view of an example of a wearable pouch of a portable battery pack.

FIGS. 8-10 are perspective views of an example of wearable pouch 510 of the portable battery pack 500. Namely, FIG. 8 shows details of side 512 of pouch 510 and of the edge of pouch 510 that includes opening 516. FIG. 8 shows opening 516 in the zipper closed state. Again, four rows of webbing 524 are provided on side 512 of pouch 510. FIG. 9 also shows details of side 512 of pouch 510, but showing the edge of pouch 510 that includes opening 520. FIG. 10 shows details of side 514 of pouch 510 and shows the edge of pouch 510 that includes opening 516. FIG. 10 shows opening 516 in the zipped closed state. Again, four rows of slots or slits 526 are provided on side 514 of pouch 510.

Figure 11A:
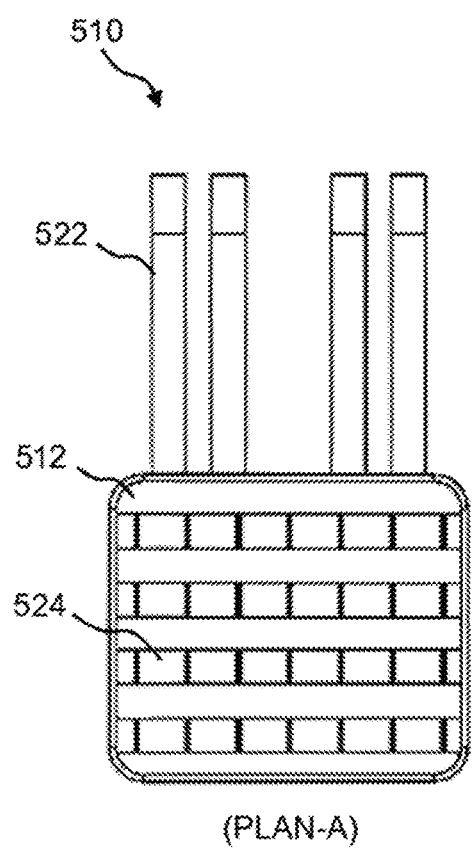
FIG. 11A illustrates a front view of a wearable pouch of a portable battery pack.
Figure 11B:
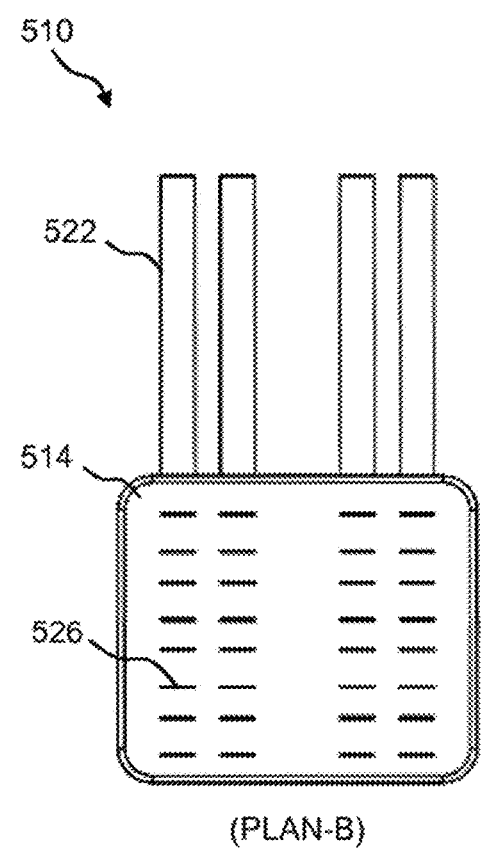
FIG. 11B illustrates a back view of a wearable pouch of a portable battery pack.
Figure 11C:
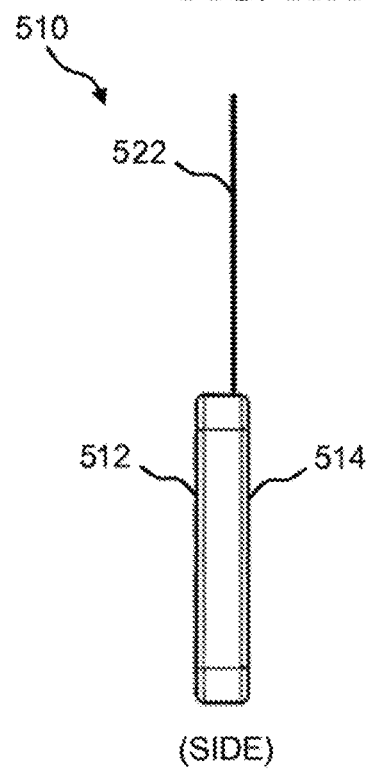
FIG. 11C illustrates a side view of a wearable pouch of a portable battery pack.
Figure 11D:
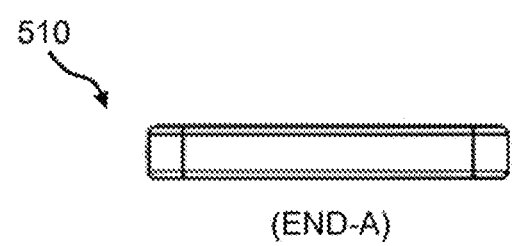
FIG. 11D illustrates an end view of a wearable pouch of a portable battery pack.
Figure 11E:
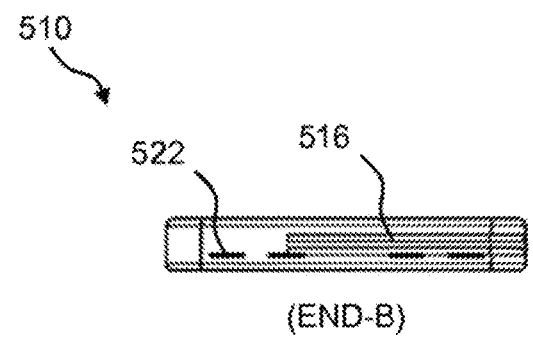
FIG. 11E illustrates another end view of a wearable pouch of a portable battery pack.

FIGS. 11A-11E illustrates various other views of wearable pouch 510 of the portable battery pack 500. Namely, FIG. 11A shows a plan view A, which is side 512 of pouch 510; FIG. 11B shows a plan view B, which is side 514 of pouch 510; FIG. 11C shows a side view; FIG. 11D shows an end view A, which is the non-strap end of pouch 510; and FIG. 11E shows an end view B, which is the strap 512—end of pouch 510.

Figure 12A:
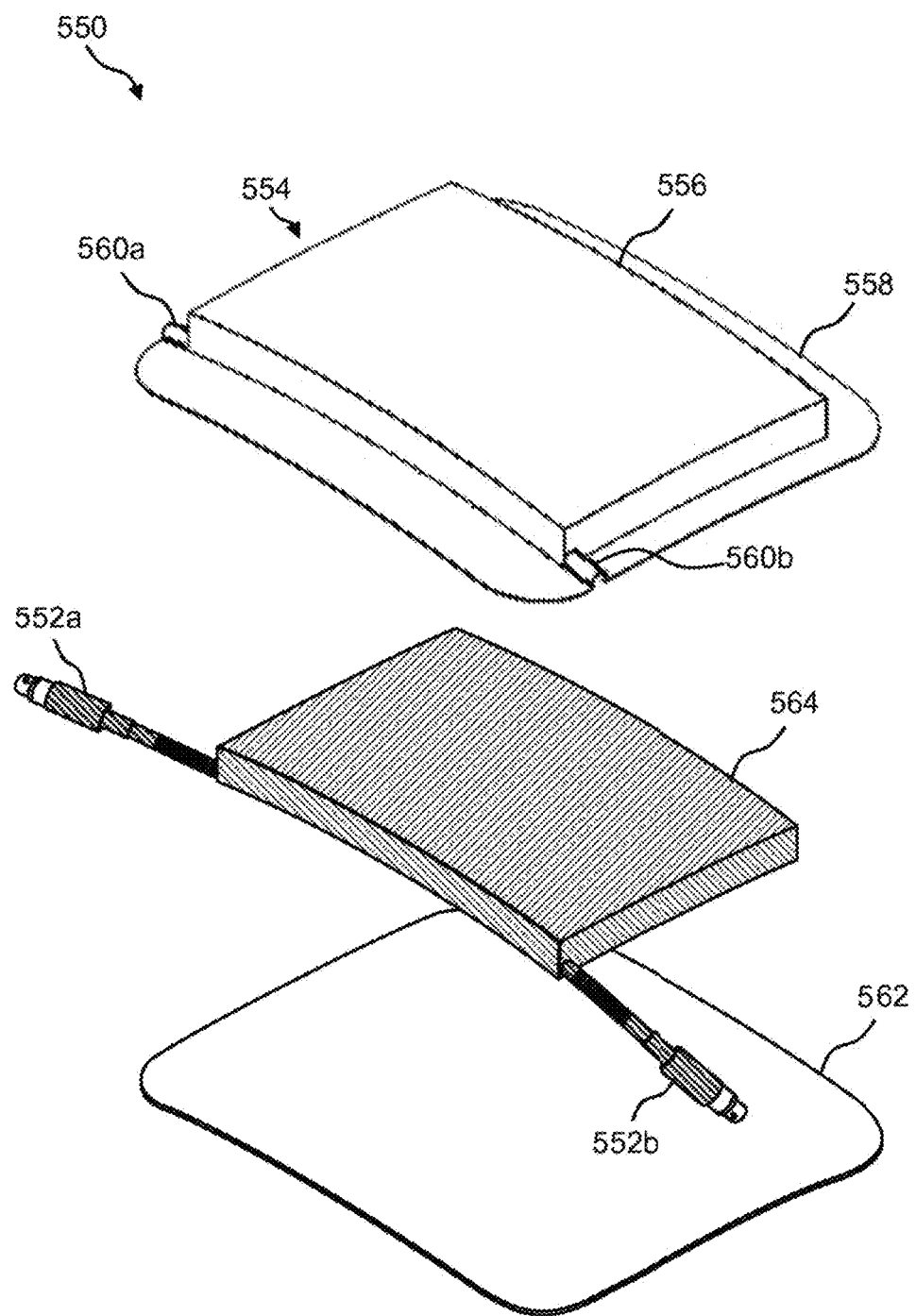
FIG. 12A illustrates an exploded view of an example of a battery of a portable battery pack.

FIG. 12A is an exploded view of an example of battery 550 of the portable battery pack 500. Battery 550 includes a battery element 564 that is housed between a battery cover 554 and a back plate 562. Battery element 564 supplies leads 552a, 552b. In one example, the output of battery element 564 is operable to be from about 5 volts DC to about 90 volts DC at from about 0.25 amps to about 10 amps.

Figure 12B:
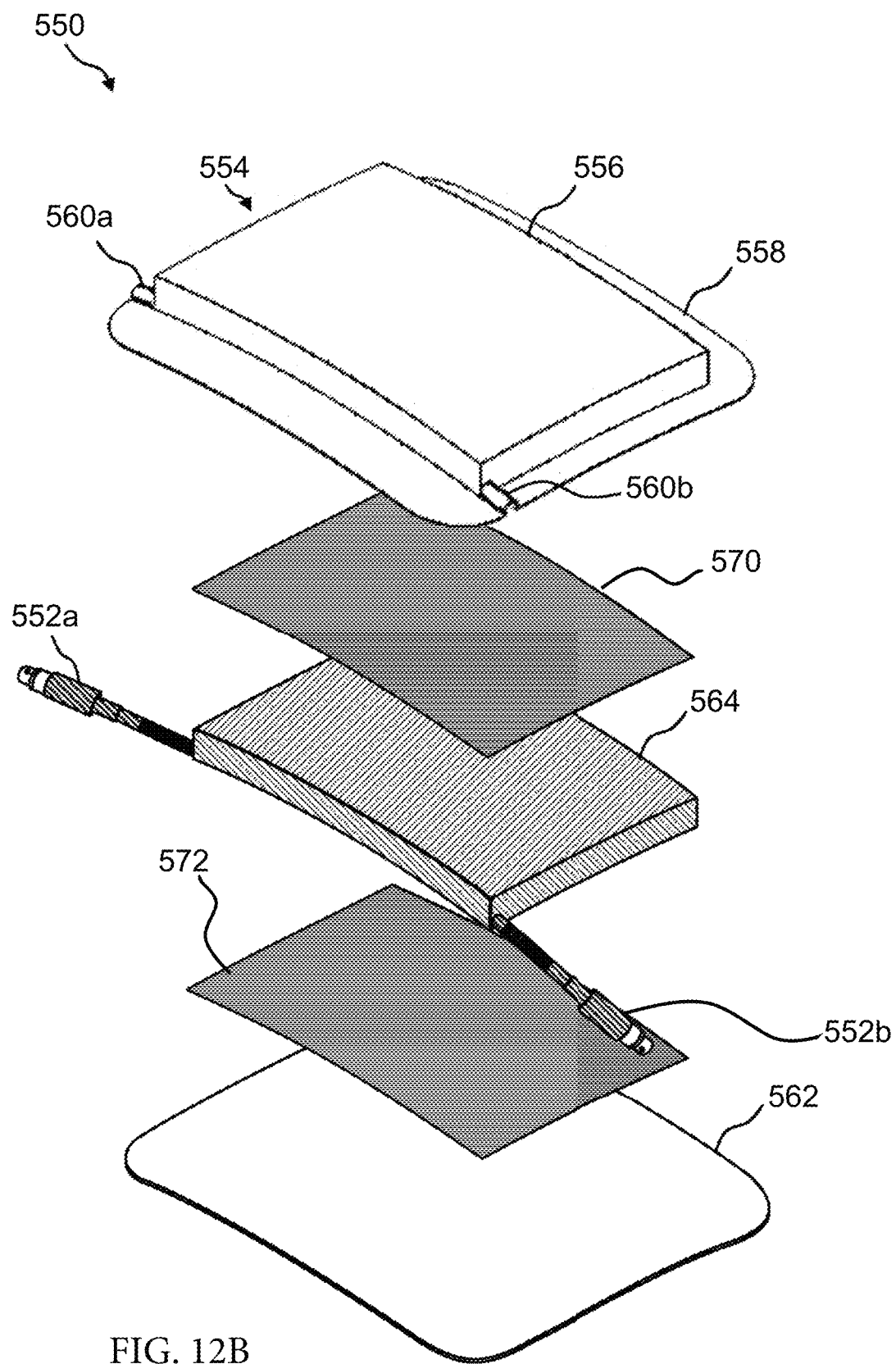
FIG. 12B illustrates an exploded view of an example of a battery of a portable battery pack into which the heat dissipating and/or heat signature-reducing material is installed.

FIG. 12B illustrates an exploded view of an example of a battery 550 of the portable battery pack 500 into which the heat dissipating and/or heat signature-reducing material is installed. Battery 550 includes a battery element 564 that is housed between a battery cover 554 and a back plate 562. A first heat-dissipating and/or heat signature-reducing layer 570 is between the battery cover 554 and the battery element 564. The first heat-dissipating and/or heat signature-reducing layer 570 protects the battery from external heat sources (e.g., a hot vehicle). A second heat-dissipating and/or heat signature-reducing layer 572 is between the battery element 564 and the back plate 562. The second heat-dissipating and/or heat signature-reducing layer 572 protects the user from heat given off by the battery element 564.

Battery cover 554 includes a substantially rectangular compartment 556 that is sized to receive battery element 564. A top hat style rim 558 is provided around the perimeter of compartment 556. Additionally, two channels 560 (e.g., channels 560a, 560b) are formed in battery cover 554 (one on each side) to accommodate the wires of leads 552a, 552b passing therethrough.

Battery cover 554 and back plate 562 are operable to be formed of plastic using, for example, a thermoform process or an injection molding. Back plate 562 is operable to be mechanically attached to rim 558 of battery cover 554 via, for example, an ultrasonic spot-welding process or an adhesive. Additionally, a water barrier material, such as silicone, is operable to be applied to the mating surfaces of rim 558 and back plate 562. Battery cover 554, back plate 562, and battery element 564 are operable to have a slight curvature or contour for conforming to, for example, the user's vest, backpack, or body armor.

Figure 13:
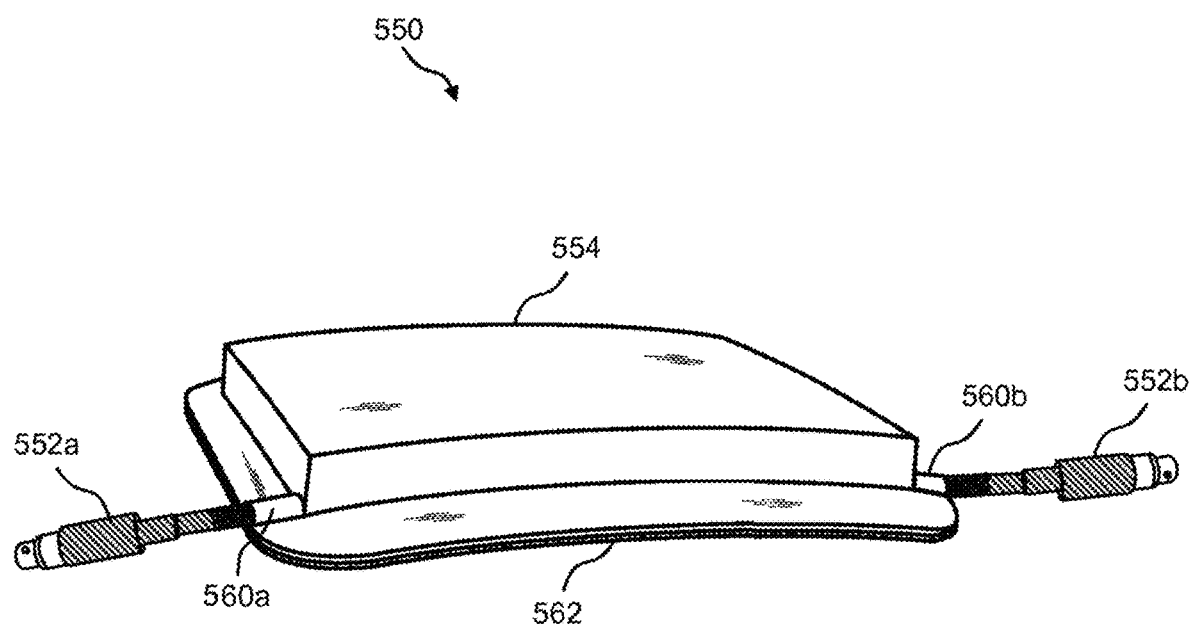
FIG. 13 is a perspective view of a battery of a portable battery pack.
Figure 14:
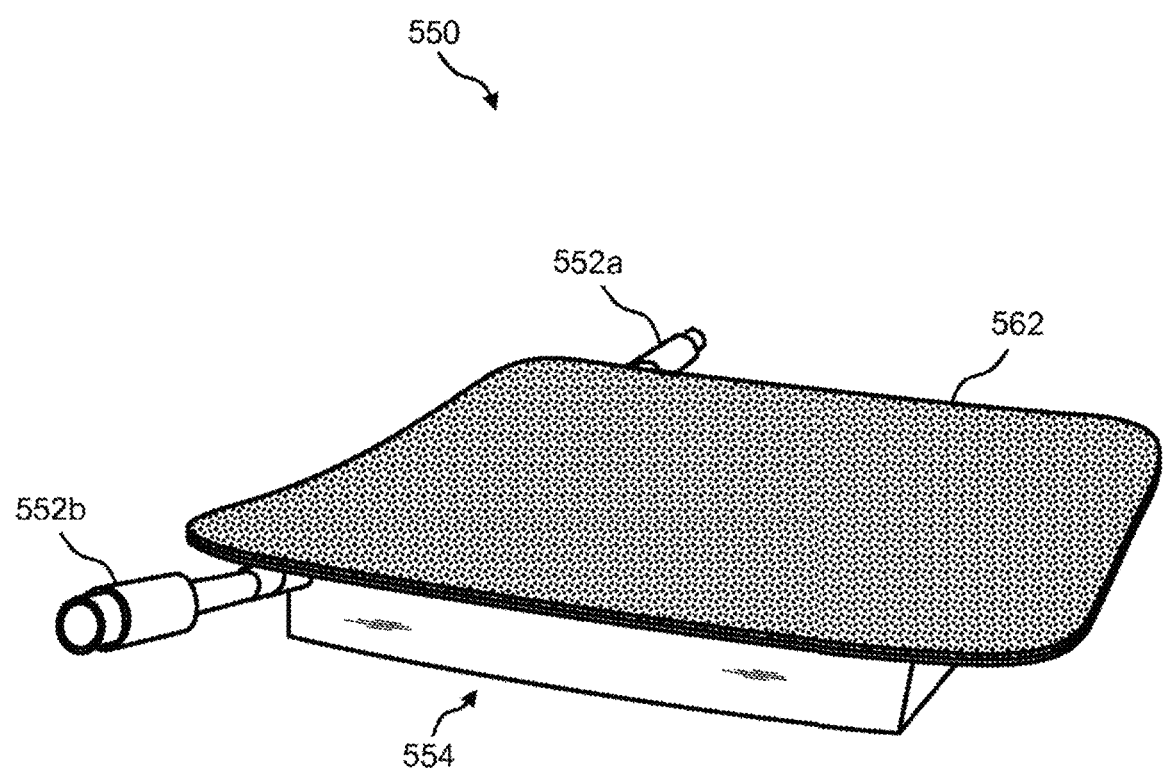
FIG. 14 is another perspective view of a battery of a portable battery pack.

FIG. 13 and FIG. 14 are perspective views of battery 550 of the portable battery pack 500 when fully assembled. Namely, FIG. 13 show a view of the battery cover 554-side of battery 550, while FIG. 14 shows a view of the back plate 562-side of battery 550.

Figure 15:
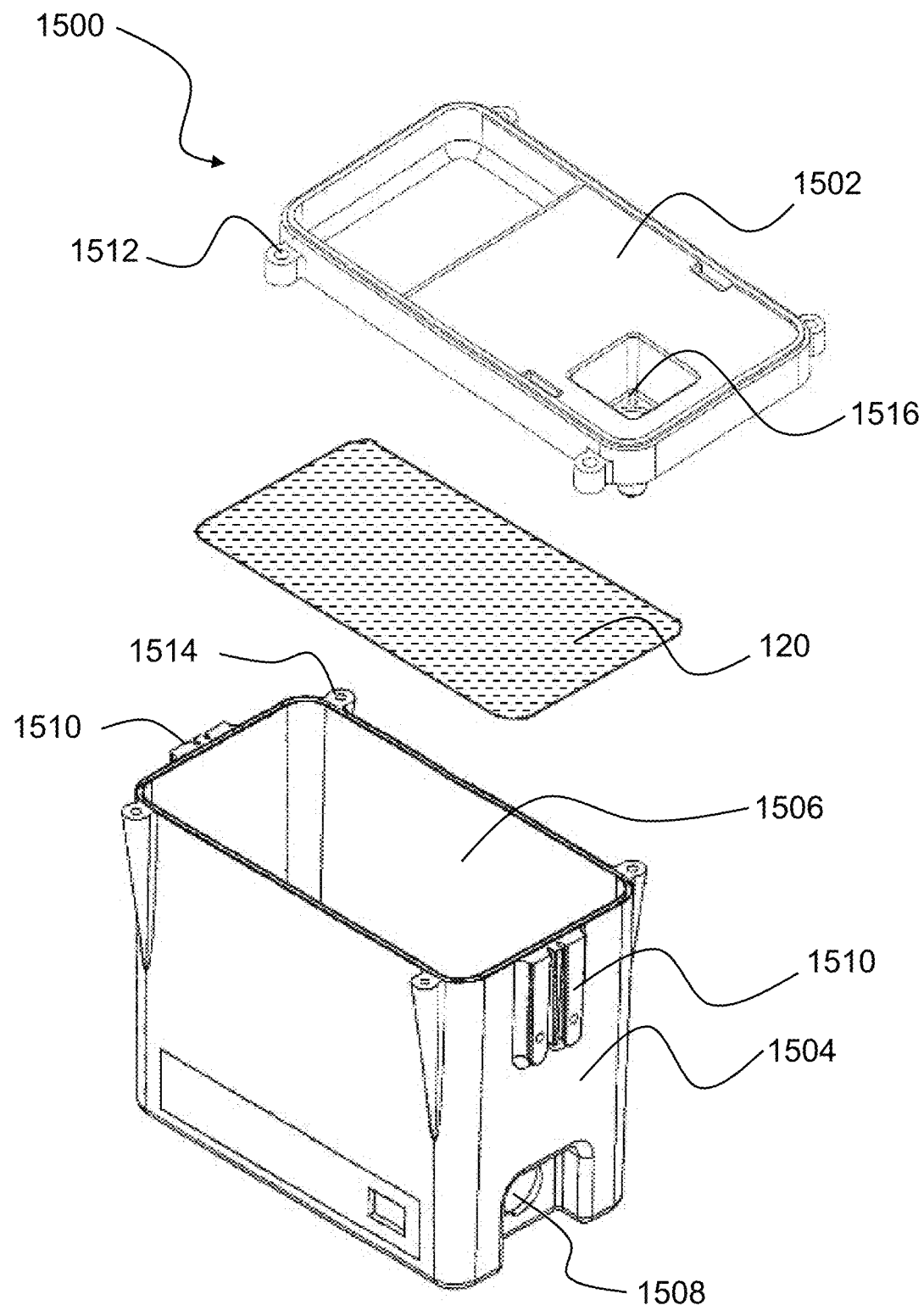
FIG. 15 illustrates an exploded view of an example of a battery into which the heat dissipating and/or heat signature-reducing material is installed.

FIG. 15 illustrates an exploded view of an example of a housing of a battery 1500 into which the heat-shielding or blocking, heat-dissipating and/or heat signature-reducing material is provided as a coating or layer. The battery 1500 is an example of equipment that is operable to be used by military personnel. The battery 1500 is but one example of using the heat-shielding or blocking, heat-dissipating and/or heat signature-reducing layer 120 for dissipating heat from and/or reducing the heat signature of an article.

The battery 1500 includes a lid 1502 and a base 1504. The base 1504 has a mounting plaque 1510 for mounting a latch on the base. The base 1504 has a recessed hole 1508 for a connector on both sides of the base 1504. The lid 1502 includes holes 1512 to attach the lid to the base 1504. The base 1504 includes holes 1514 to attach the lid to the base of the housing. Screws (not shown) are placed through holes 1512 and 1514 to attach the lid to the base. The lid 1502 includes a hole 1516 for mounting a connector.

In one embodiment, the battery housing or base 1504 with sides depending upwards therefrom is a unitary and integrally formed piece of plastic formed via injection molding. Advantageously, when the heat-shielding or blocking, heat-dissipating and/or heat signature-reducing material is utilized in conjunction with the base, the base is operable to be manufactured from much thinner plastic than in prior art battery housings because the heat-shielding or blocking, heat-dissipating and/or heat signature-reducing material effectively blocks, shields from, and dissipates heat. In contrast, prior art plastic battery housings require thicker plastic to provide heat blocking, shielding, and dissipation. When used in conjunction with the heat-shielding or blocking, heat-dissipating and/or heat signature-reducing material, the thin plastic material requirement of the present invention provides for cost savings over the prior art. In fact, some embodiments of the housing of the present invention use materials and types of materials which traditionally have been disfavored because of the heat generated from batteries. Such materials include by way of example not limitation, aluminum, titanium, nickel, magnesium, microlattice metals, composite metal foams, and combinations thereof. Notably, many of these materials were previously disfavored for the base because of the heat transfer and dissipation from the batteries. Materials which provide other advantages such as bullet resistance, such as composite metal foams, are also used for the base in one embodiment of the present invention.

The battery housing or base 1504 for removably holding at least one battery is coated with a paint 1506 for reducing electromagnetic interference. In a preferred embodiment, the paint 1506 includes copper. Although the base 1504 of the at least one battery 1500 is coated with the paint 1506, which functionally protects the bottom and sides of the at least one battery from external heat, the top of the battery is exposed to external heat when attached to heat generating equipment (e.g., radio). Since external heat is operable to damage the battery and/or cause it to overheat, the heat-shielding or blocking, heat-dissipating and/or heat signature-reducing material layer or coating is functionally constructed and configured within the interior of the housing or base to protect the removable batteries disposed therein. In this particular example, the radio generates a significant heat profile and the heat-shielding material is operable to block that external heat emanating from the radio. The material is further functional to dissipate heat generated by the at least one battery during operation of the radio, which draws power from the at least one battery, and reduces the heat signature of the at least one battery disposed within the housing or base.

In another example of embodiments of the present invention, the heat-shielding or blocking, heat-dissipating and/or heat signature-reducing material completely covers the interior of a housing having a plurality of battery cells removably disposed therein. Other examples include a heat-shielding or blocking, heat-dissipating and/or heat signature-reducing material layer having anti-static, anti-radio frequency (RF), anti-electromagnetic interference (EMI), anti-tarnish, and/or anti-corrosion materials and properties that effectively protect battery-operated devices and/or the batteries that power them from damage or diminished operation.

The battery housing or base 1504 includes a plurality of sealed battery cells or individually contained battery cells, i.e. batteries with their own casings, removably disposed therein. In a preferred embodiment, the battery cells are electrochemical battery cells, and more preferably, include lithium ion rechargeable batteries. In one embodiment the batteries are 18650 cylindrical cells. The plurality of battery cells is operable to be constructed and configured in parallel, series, or a combination thereof. Preferably, the plurality of electrochemical battery cells is removably disposed within the base or battery housing or container. For example, the plurality of battery cells is operable to be replaced if they no longer hold a sufficient charge.

Figure 16:
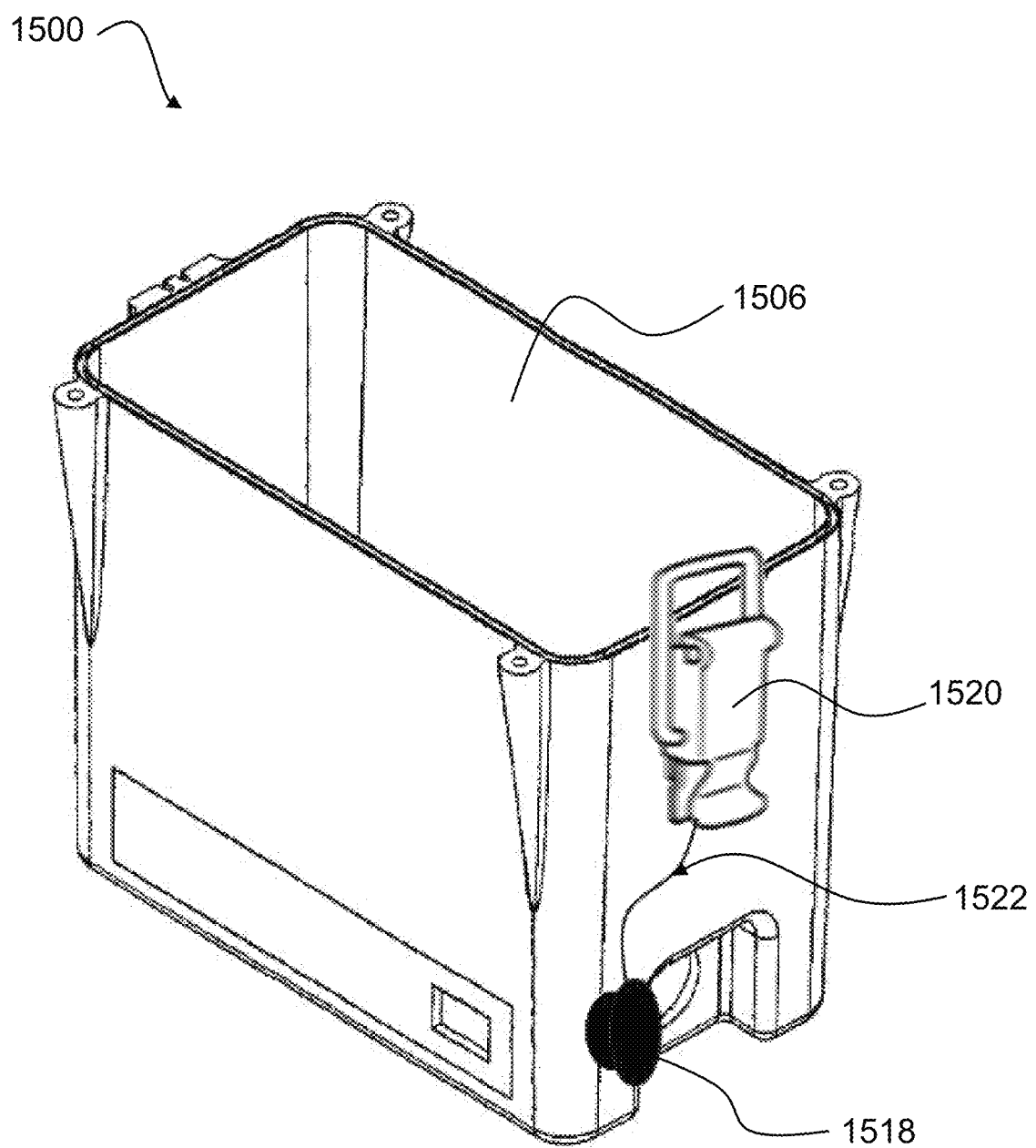
FIG. 16 illustrates a view of an example of a battery base.

FIG. 16 illustrates a view of an example of a battery base 1504. The base 1504 is shown with a latch 1520. The latch 1514 is operable to attach the battery 1500 to a military radio (e.g., AN/PRC-117G) with a corresponding catch. A dust cap 1518 is attached to the battery base 1504 via a lanyard 1522 attached to the mounting plaque. The length of the lanyard 1522 is such that no part of the dust cap 1512 is capable of moving underneath the battery 1500. Batteries often have the dust cap attached to the housing via a dress nut, which allows the dust cap to move underneath the battery. When the dust cap is underneath the battery, the battery (and any equipment attached to the battery) may become unstable and tip over. If the dust cap is underneath the battery, it may lead to the dust cap being torn from the housing. The battery would no longer be protected from dust and other environmental contaminants.

Figure 17:
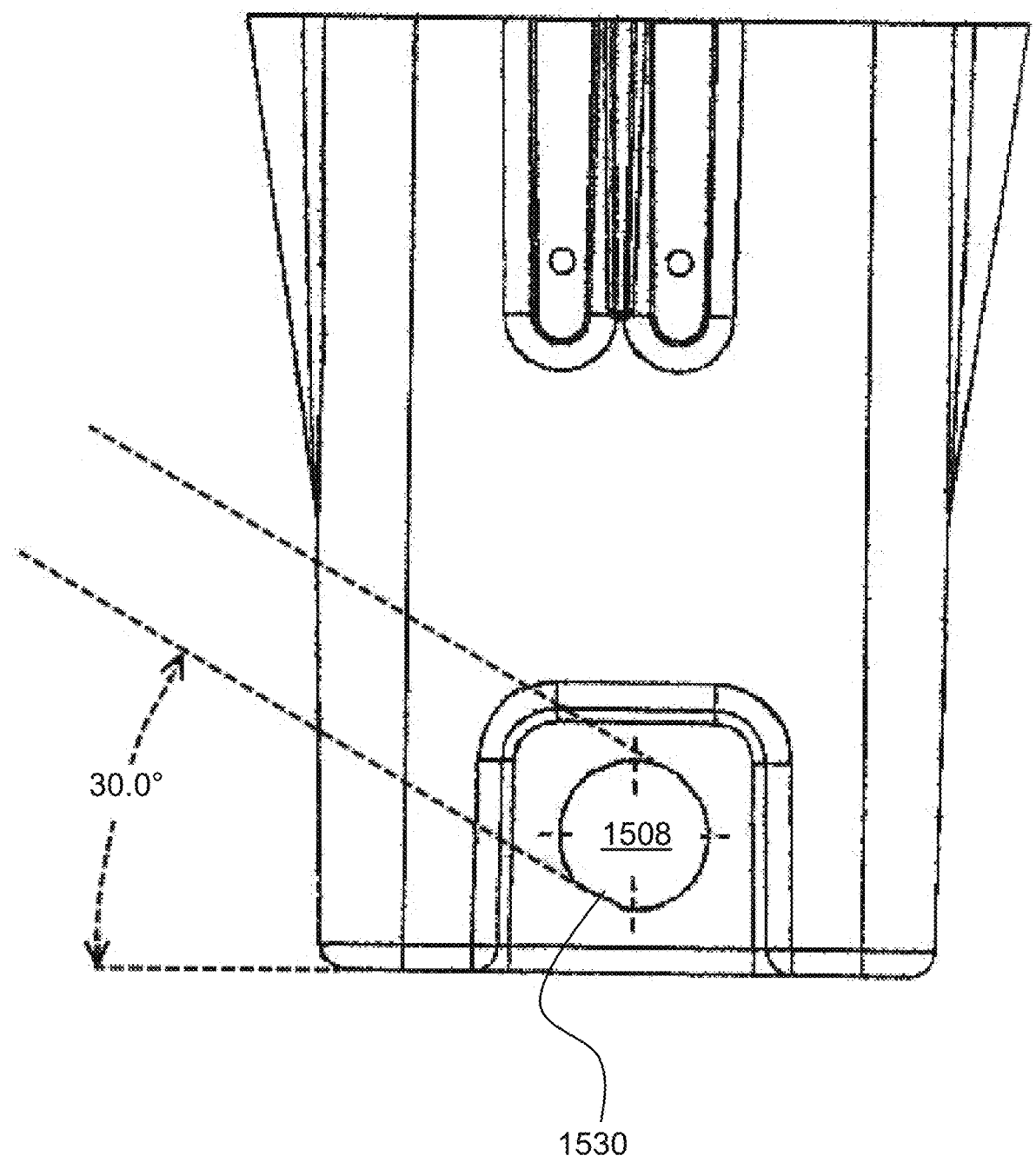
FIG. 17 illustrates another view of an example of a battery base.
Figure 19A:
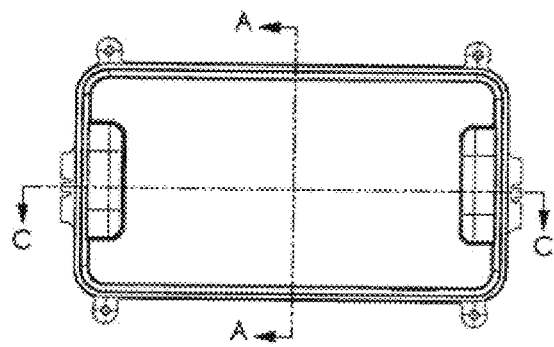
FIG. 19A illustrates a top view perspective of the battery base.
Figure 19B:
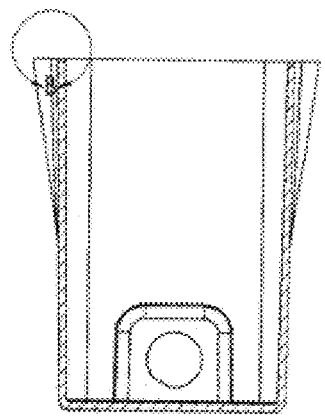
FIG. 19B illustrates a cross-section view of the battery base.
Figure 19C:
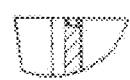
FIG. 19C illustrates a detail view of a part of the cross-section view of the battery base shown in FIG. 19B.
Figure 19D:
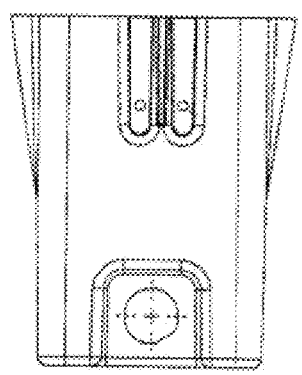
FIG. 19D illustrates a side view perspective of the battery base.
Figure 19E:
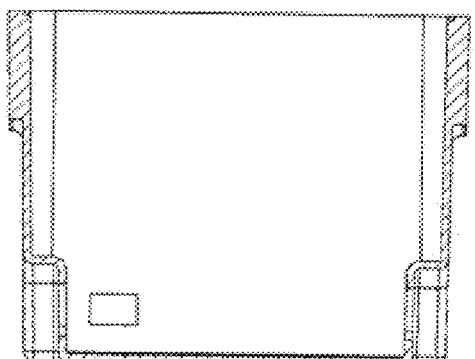
FIG. 19E illustrates another cross-section view of the battery base.
Figure 19F:
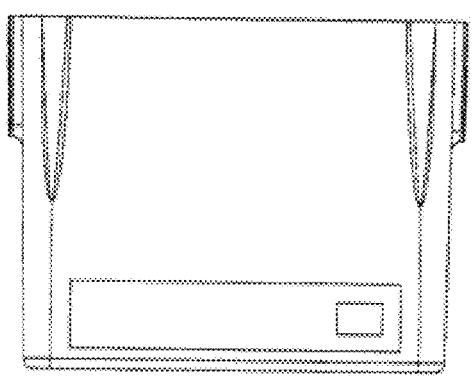
FIG. 19F illustrates another side view perspective of the battery base.
Figure 20B:
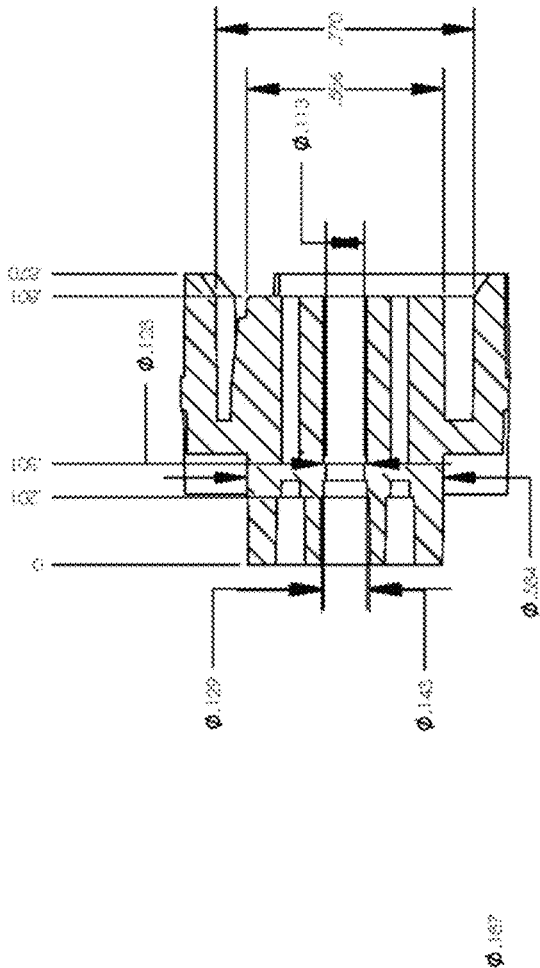
FIG. 20B illustrates a cross-section view of a BA-5590 female connector.
Figure 20A:
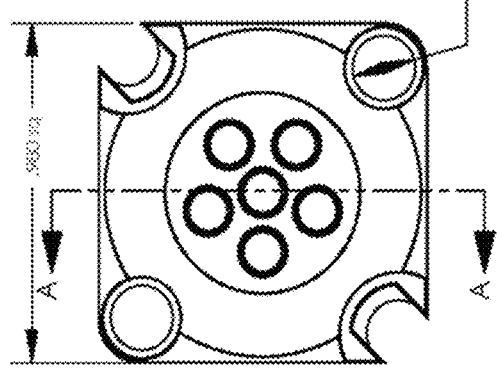
FIG. 20A illustrates a top perspective view of a BA-5590 female connector.
Figure 20D:
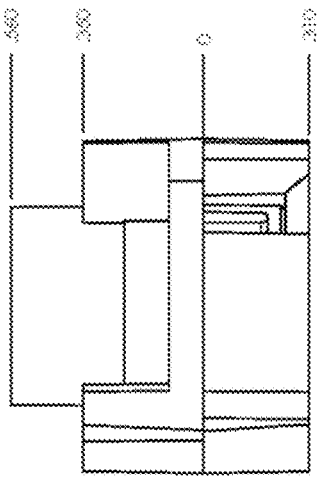
FIG. 20D illustrates a side perspective view of a BA-5590 female connector.
Figure 20C:
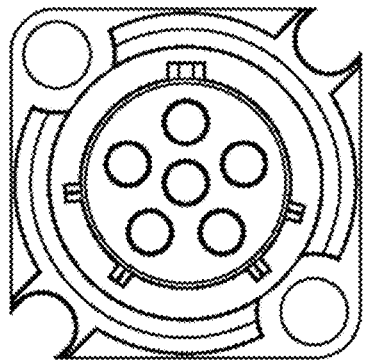
FIG. 20C illustrates a bottom perspective view of a BA-5590 female connector.

FIG. 17 illustrates another view of an example of a battery base 1504. In a preferred embodiment, the recessed hole 1508 includes a flat side 1530 for installing a connector with a keyway. A right angle cable is used to connect the battery to external power consuming devices and/or external power sources. The keyway ensures that the right angle cable does not interfere with latches used to attach the battery to the radio. The keyway in FIG. 17 forces the cable to a 30.0° angle. Other angles are compatible with the present invention.

FIGS. 18A-D illustrate various other views of the lid.
FIGS. 19A-F illustrate various other views of the base.

FIGS. 20A-20D illustrate views of a BA-5590 female connector. In a preferred embodiment, the BA-5590 female connector is installed in the hole of the lid.

Figure 21:
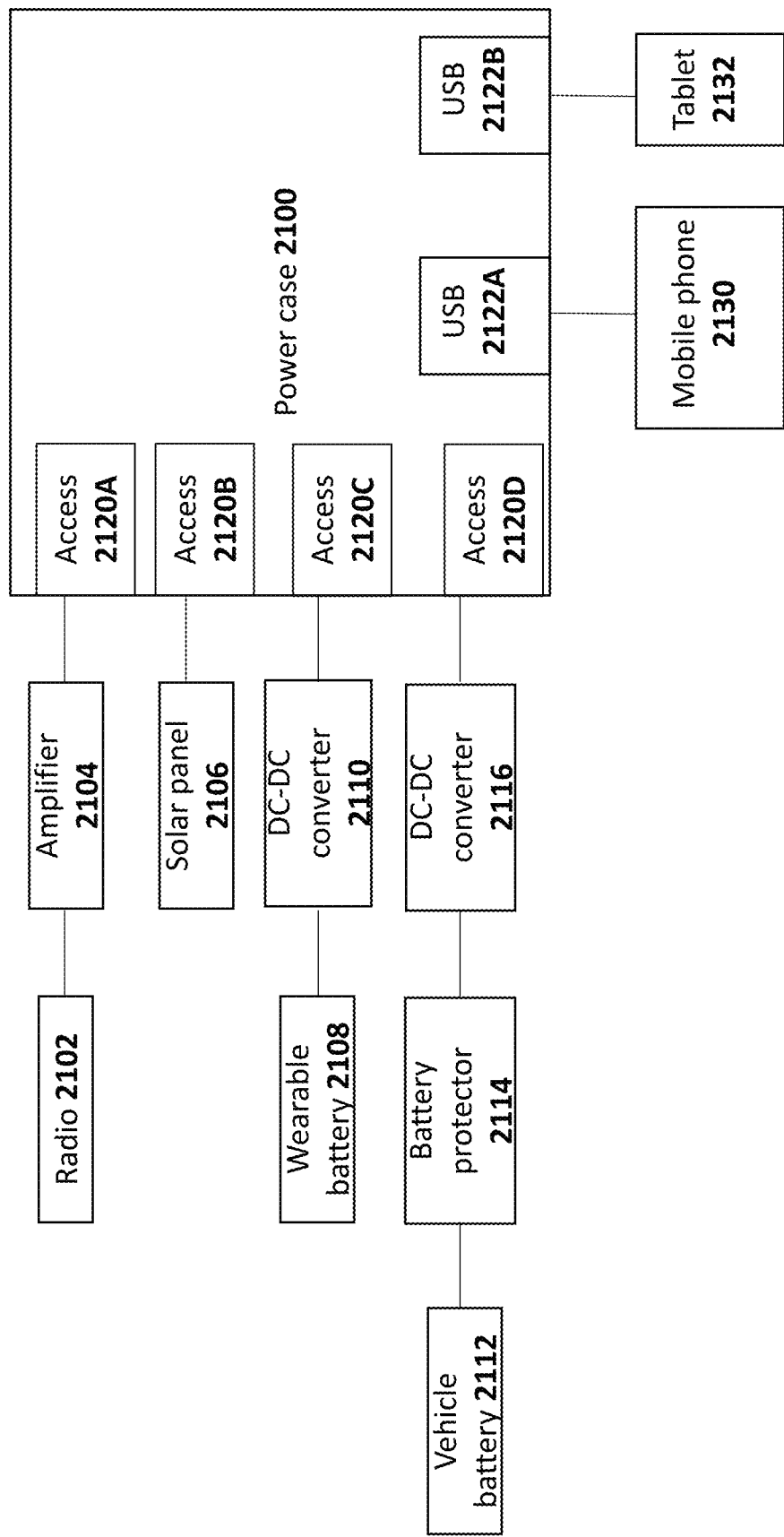
FIG. 21 illustrates a block diagram of a portable power case into which the heat dissipating and/or heat signature-reducing material is installed.

FIG. 21 illustrates a block diagram of a portable power case into which the heat dissipating and/or heat signature-reducing material is installed. The portable power case 2100 is an example of equipment that is operable to be used by military personnel. The portable power case 2100 is but one example of using the heat-shielding or blocking, heat-dissipating and/or heat signature-reducing layer 120 for dissipating heat from and/or reducing the heat signature of an article.

The portable power case 2100 has four access ports 2120A-2120D and two USB ports 2122A-2122B. The portable power case 2100 is operable to connect to an amplifier 2104 through an access port (e.g., 2120A). The amplifier 2104 connects to a radio 2102. The portable power case 2100 is operable to be charged using a solar panel 2106 when connected to an access port (e.g., 2120B). The portable power case 2100 is operable to charge a wearable battery 2108. The portable power case 2100 and wearable battery 2108 are connected through a DC-DC converter cable 2110 that is in contact with an access port (e.g., 2120C). The portable power case 2100 is operable to be charged using a vehicle battery 2112. The vehicle battery 2112 is operable to charge the portable power case 2100 for a brief period after the ignition of the vehicle is turned off. The system includes a battery protector 2114 connected to an access port (e.g., 2120D) to prevent the vehicle battery from being drained. The battery protector 2114 is connected to the access port 2120D through a DC-DC converter cable 2116. The USB ports 2122A-2122B are operable to charge electronic devices, including, but not limited to, a mobile phone 2130 and/or a tablet 2132.

In a preferred embodiment, the amplifier is a 50 W wideband vehicular amplifier adapter (RF-7800UL-V150 by Harris Corporation) or a power amplifier for the Falcon III VHF handheld radio (RF-7800V-V50x by Harris Corporation). In a preferred embodiment, the radio is a PRC-117G. Alternative radios and/or amplifiers are compatible with the present invention.

Figure 22:
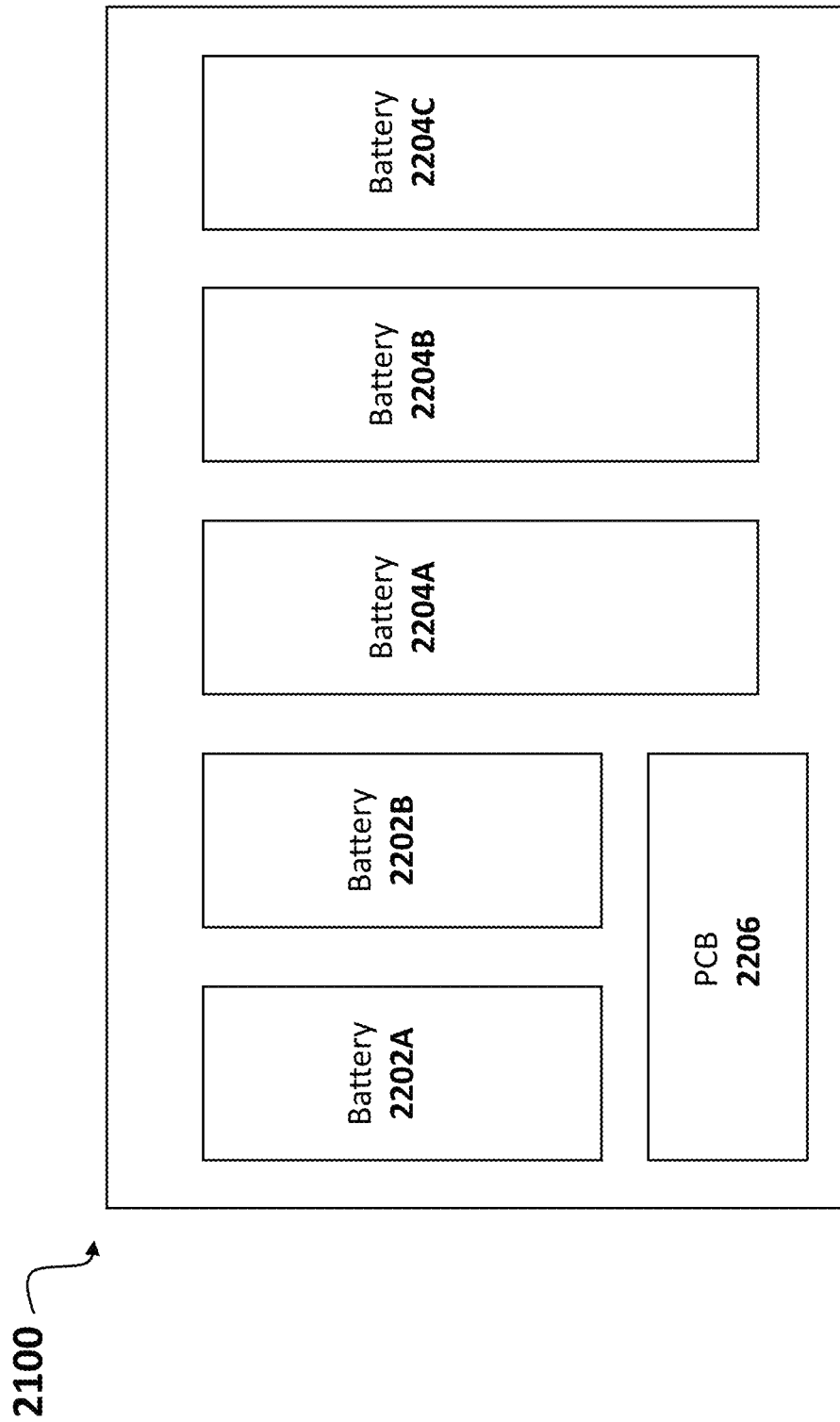
FIG. 22 illustrates a block diagram showing the inside of one embodiment of the portable power case.

FIG. 22 illustrates a block diagram showing the inside of one embodiment of the portable power case 2100. The portable power case 2100 is formed of two batteries 2202A-2202B and three batteries 2204A-2204C. In a preferred embodiment, the batteries 2202A-2202B are 29.4V lithium ion rechargeable batteries in a housing for mating with a PRC-117G radio. In a preferred embodiment, the batteries 2204A-2204C are 29.4V lithium ion rechargeable batteries in a housing for mating with a PRC-117F radio. Alternative voltages, housings, and/or number of batteries are compatible with the present invention. The batteries 2202A-2202B and 2204A-2204C are connected to a PCB 2206. In a preferred embodiment, the batteries 2202A-2202B and 2204A-2204C include a heat-dissipating layer between the lid and the plurality of electrochemical battery cells.

Figure 23:
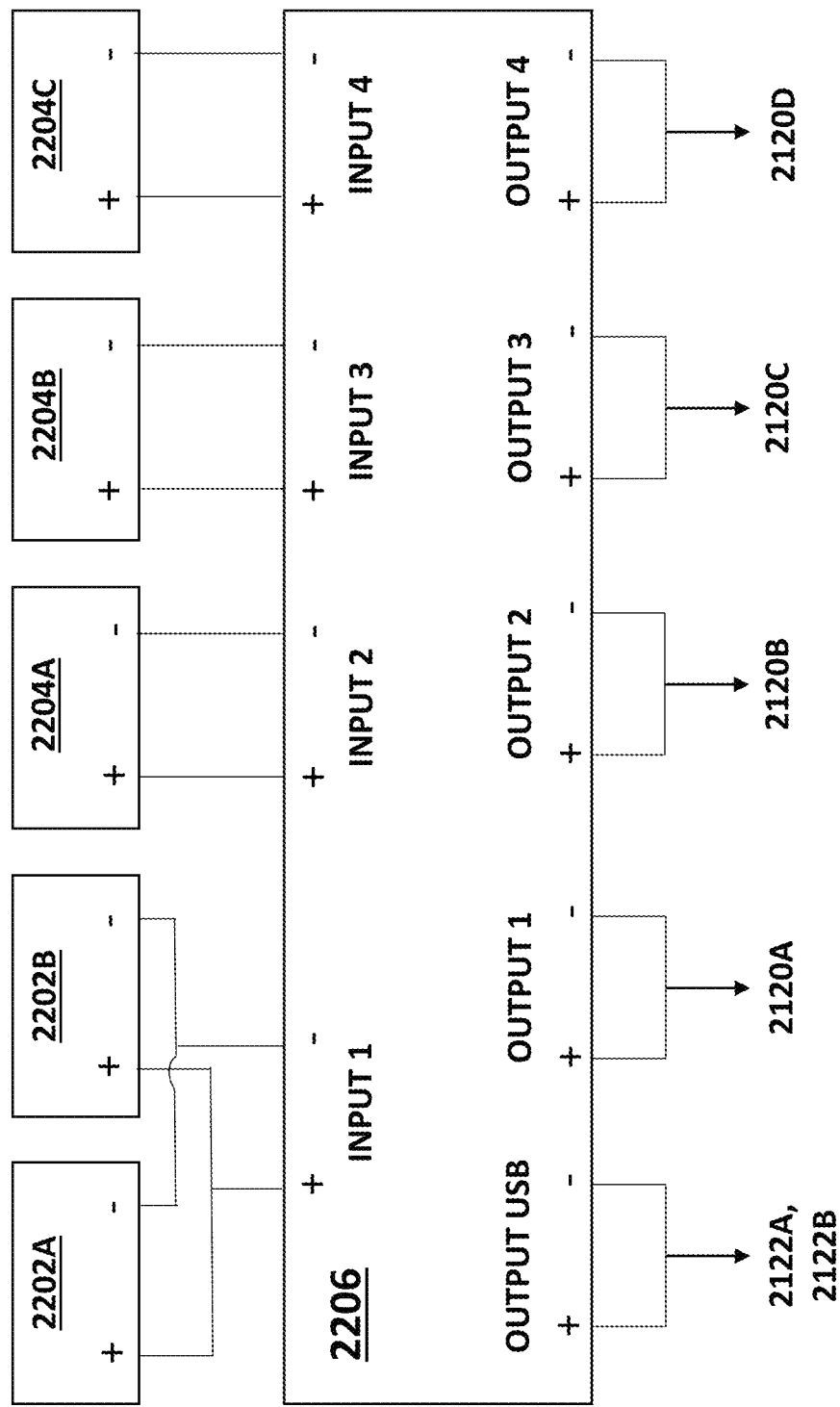
FIG. 23 illustrates a block diagram of the connections to the printed circuit board (PCB).

FIG. 23 illustrates a block diagram of the connections to the PCB. The PCB 2206 has four inputs. Batteries 2202A and 2202B are in parallel with each other and connected to the PCB at INPUT 1. Battery 2204A is connected to the PCB at INPUT 2. Battery 2204B is connected to the PCB at INPUT 3. Battery 2204C is connected to the PCB at INPUT 4. The PCB 2206 has five outputs. OUTPUT 1 powers access port 2120A, OUTPUT 2 powers access port 2120B, OUTPUT 3 powers access port 2120C, OUTPUT 4 powers access port 2120D, and OUTPUT USB powers USB ports 2122A and 2122B.

In a preferred embodiment, the PCB uses ferrite beads to provide EMI shielding. The PCB also uses capacitors to protect the batteries.

Figure 24:
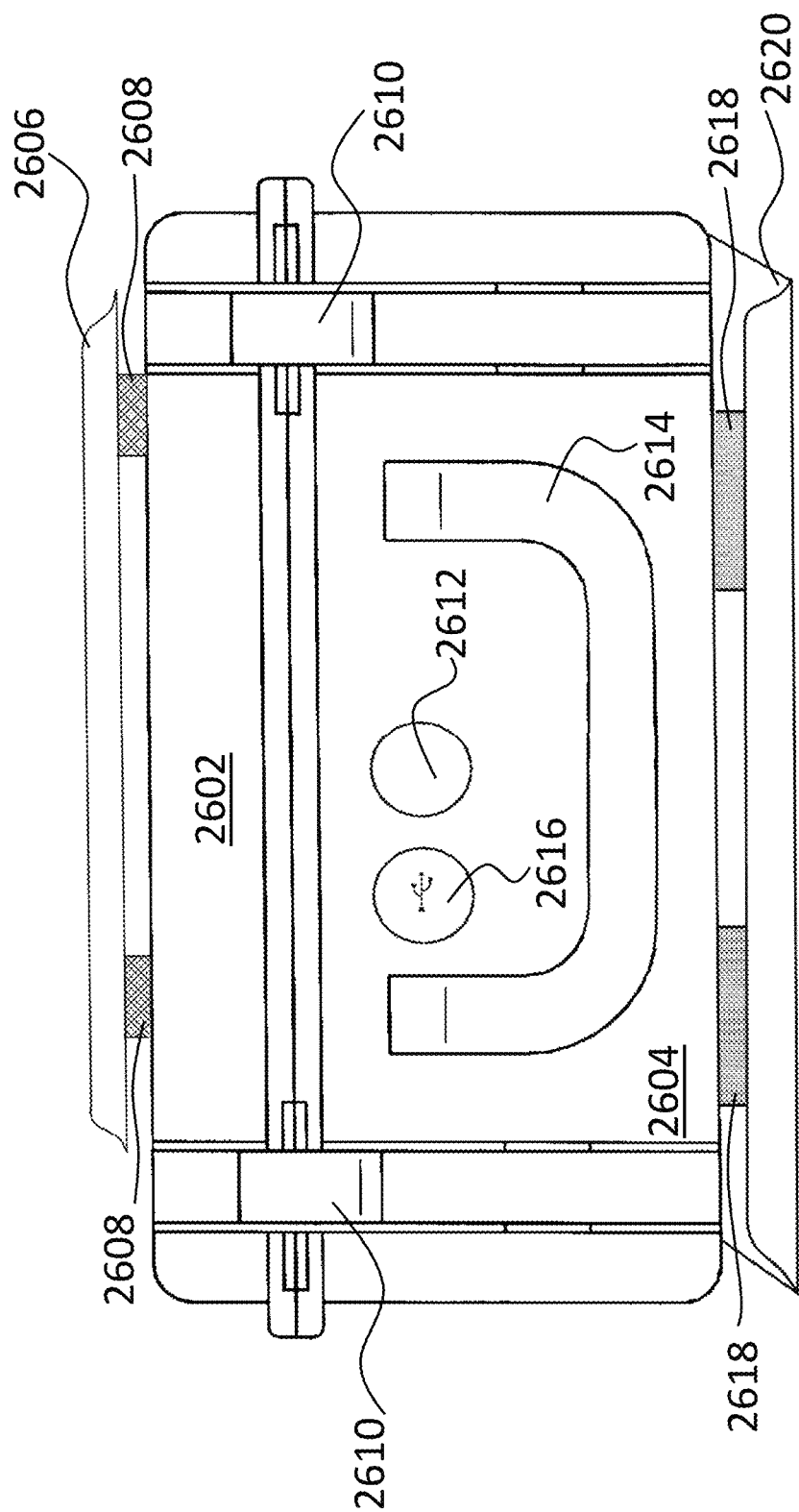
FIG. 24 illustrates a view of the exterior of one embodiment of the portable power case.

The portable power case is enclosed in a hard case (e.g., Pelican 1500) in a preferred embodiment. The hard case is formed of polypropylene in one embodiment. FIG. 24 illustrates a view of the exterior of the portable power case. The case includes a top portion 2602 and a bottom portion 2604. A base for mounting at least one amplifier and at least one radio 2606 is attached to the top portion 2602 through shock absorbing cylinders 2608. The case includes latches 2610 for securing the contents of the case, a pressure purge valve 2612, and a handle 2614. The latches include rescue tape in a preferred embodiment to prevent the latches from rattling. A cap 2616 is provided to protect the USB ports. A base for securing the portable power case to a vehicle 2620 is attached to the bottom portion 2604 through shock absorbing cylinders 2618.

In a preferred embodiment, the base for mounting at least one amplifier and at least one radio 2606, the shock absorbing cylinders 2618, and the base for securing the portable power case to a vehicle 2620 are formed of a shock mount interface assembly (e.g., Harris 12050-3050-01). Alternative mounts are compatible with the present invention.

Figure 25:
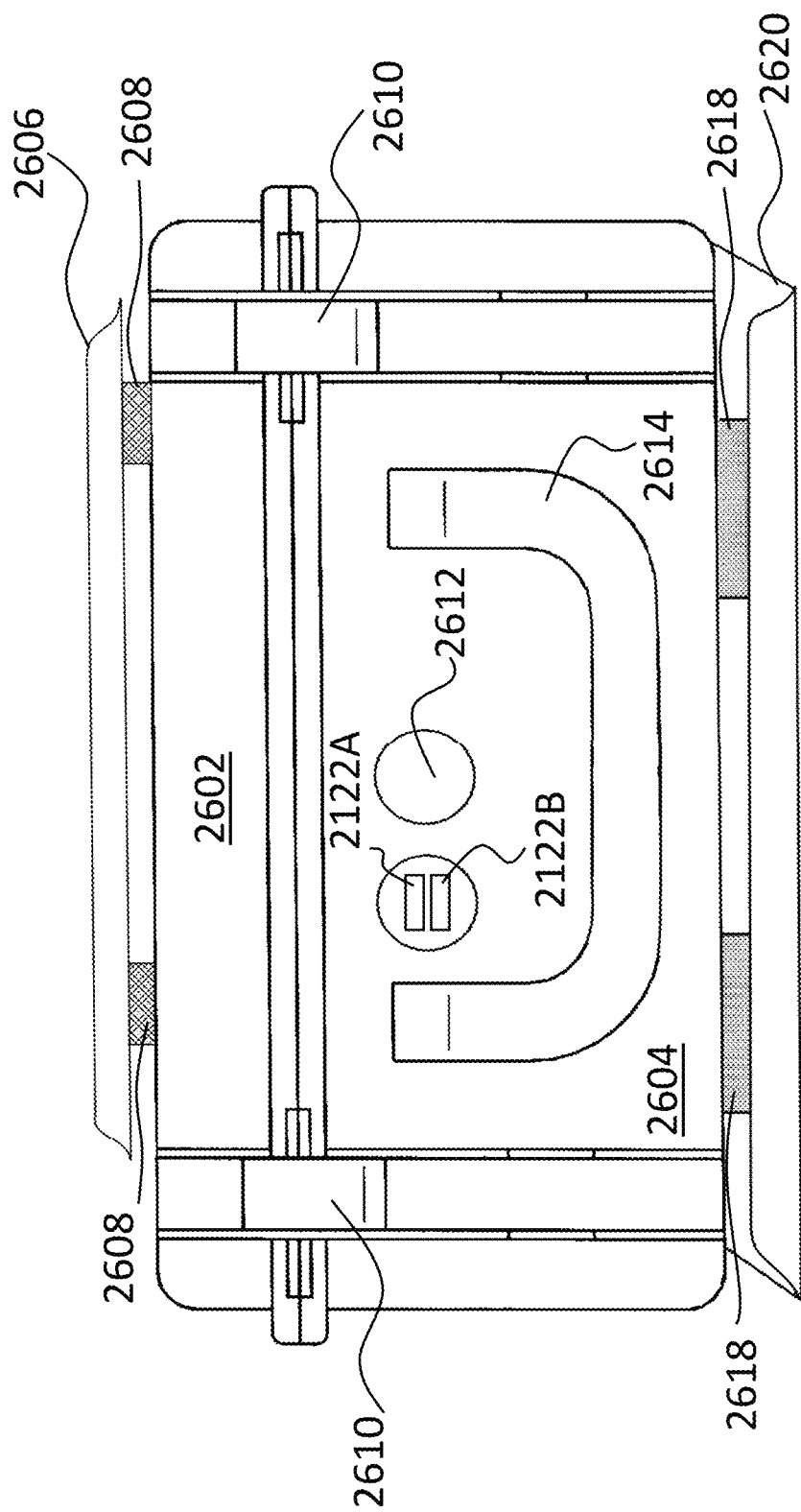
FIG. 25 illustrates a view of the portable power case showing the USB ports.

FIG. 25 illustrates a view of the case with the cap (not shown) removed to show the USB ports. USB ports 2122A and 2122B are accessible on the front of the case.

Figure 26:
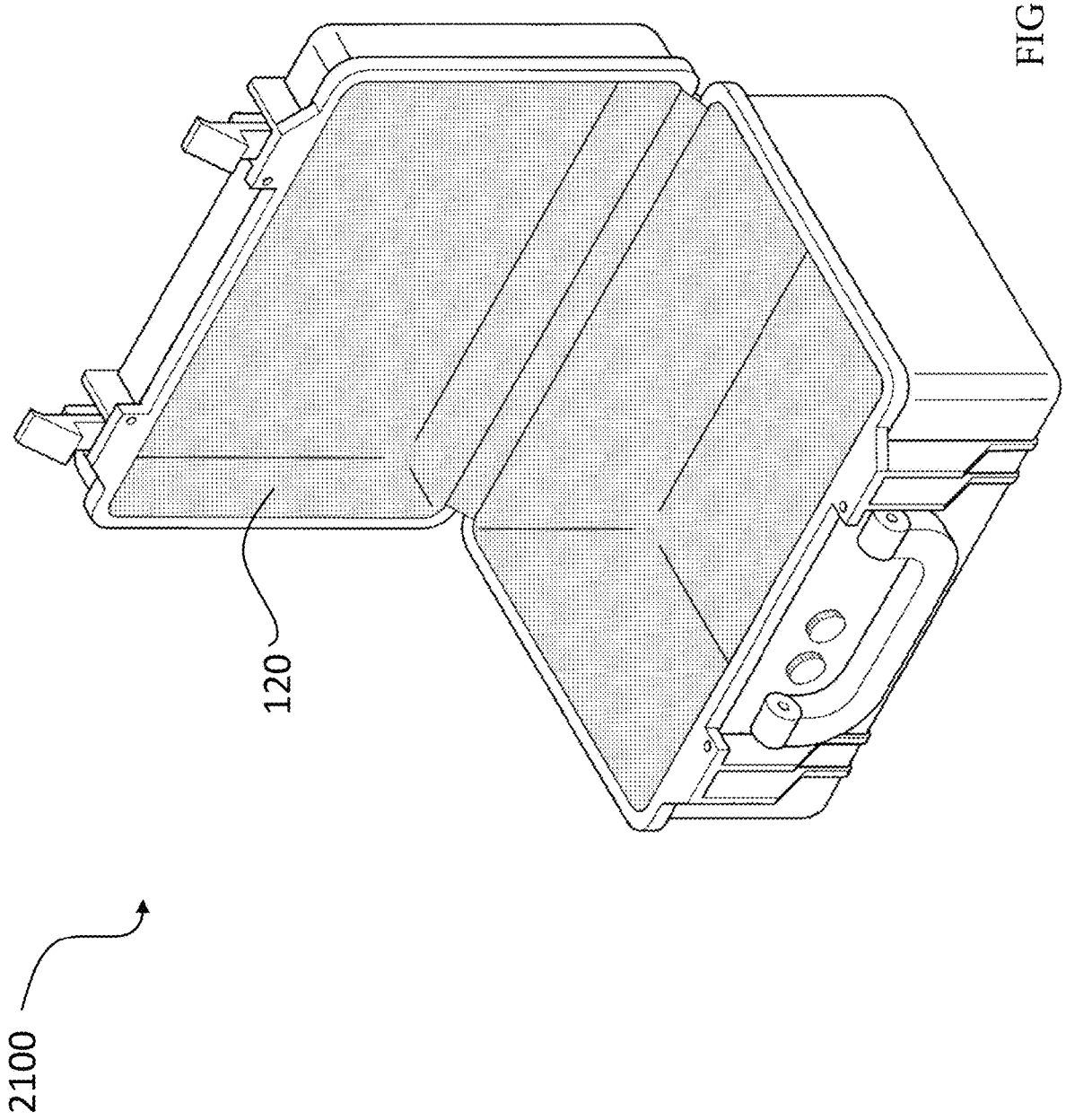
FIG. 26 illustrates one example of the portable power case lined with material resistant to heat.

The hard case is lined with foam in one embodiment. Additionally or alternatively, the case is lined with a material that is resistant to heat and/or electromagnetic interference. FIG. 26 shows one example of the portable power case 2100 lined with material resistant to heat 120. The amplifier and radio give off a significant amount of heat. The heat resistant material prevents heat transfer from the amplifier and radio to the batteries. If a lithium ion battery overheats, it reduces performance of the battery, reduces the life span of the battery, and may result in a fire.

Additionally, the heat resistant material may also be anti-electromagnetic interference material. The anti-electromagnetic interference material lining creates a Faraday cage and prevents disruption by electromagnetic radiation. In an alternative embodiment, the case is operable to be coated with an electromagnetic interference and/or radio frequency interference shielding paint including copper, silver, nickel, and/or graphite.

The portable power case provides for modularity that allows the user to disassemble and selectively remove the batteries installed within the portable power case housing that is lined with the heat-shielding or blocking, heat-dissipating and/or heat signature-reducing layer in a preferred embodiment. The modularity allows the user to comply with Survival, Evasion, Resistance, and Escape (SERE) training. In case of attack, each of the batteries is operable to be used to power the at least one radio and/or the at least one amplifier, as well as other gear.

Figure 27B:
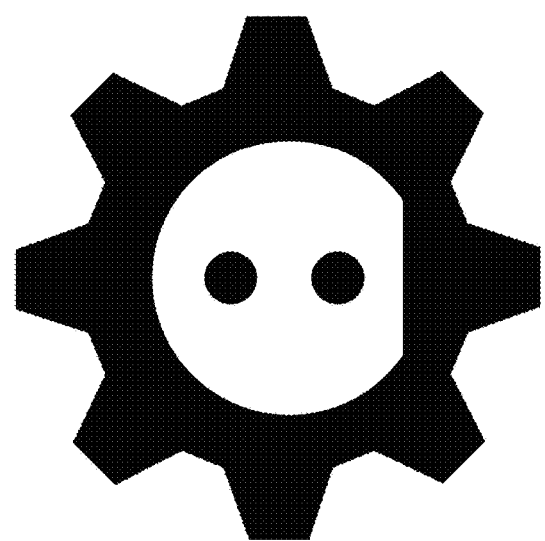
FIG. 27B illustrates a keyway of the access ports of the portable power case.
Figure 27A:
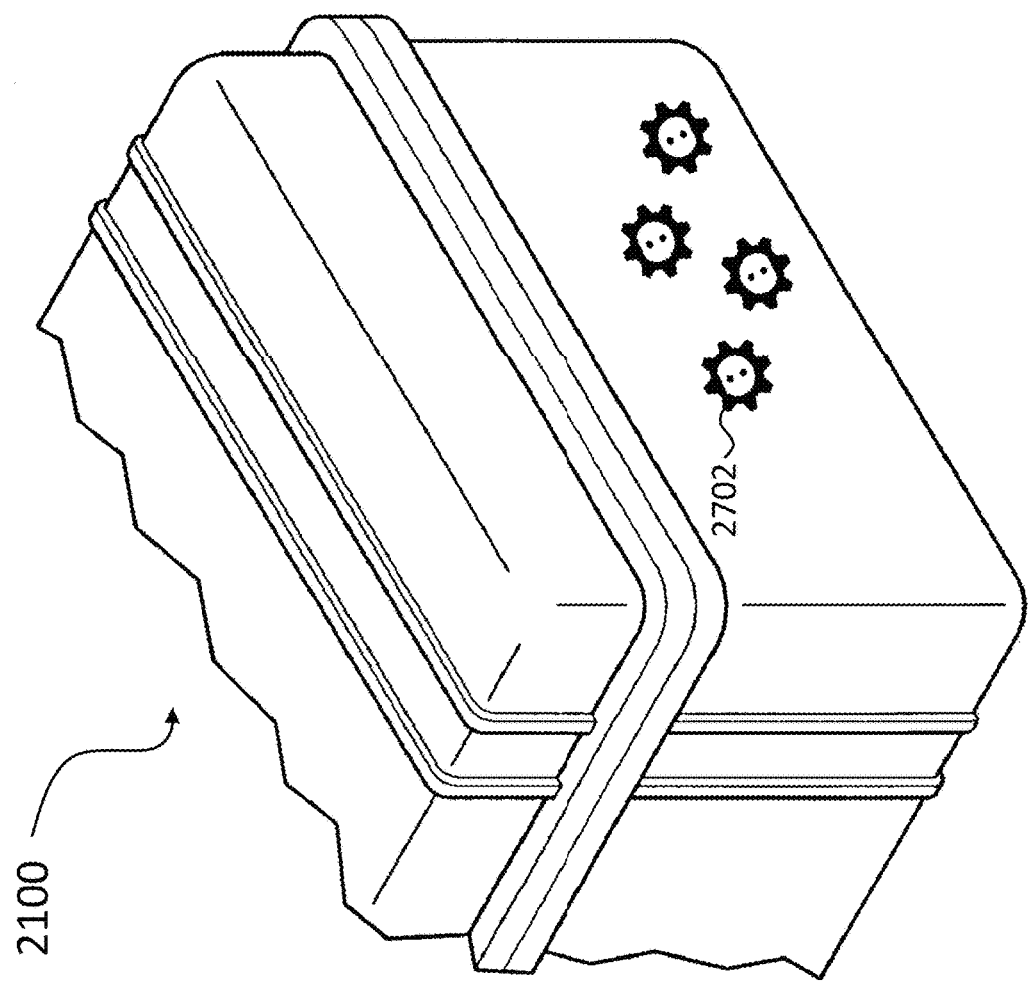
FIG. 27A illustrates the access ports of the portable power case.

The access ports are shown in FIG. 27A. The access ports are preferably staggered vertically and horizontally to allow for easy access to the ports. As shown in FIG. 27B, the preferred embodiment includes a keyway (shown as a flat portion of the connector) to ensure correct orientation of cables. In a preferred embodiment, the cables connected to the access ports located on the top row orient downwards and the cables connected to the access ports located on the bottom row orient upwards. Alternatively, the cables connected to the access ports located on the top row orient downwards and the cables connected to the access ports located on the bottom row orient downwards. A gasket 2702 is provided around each of the access ports to seal the interior of the case from the external environment.

Figure 28:
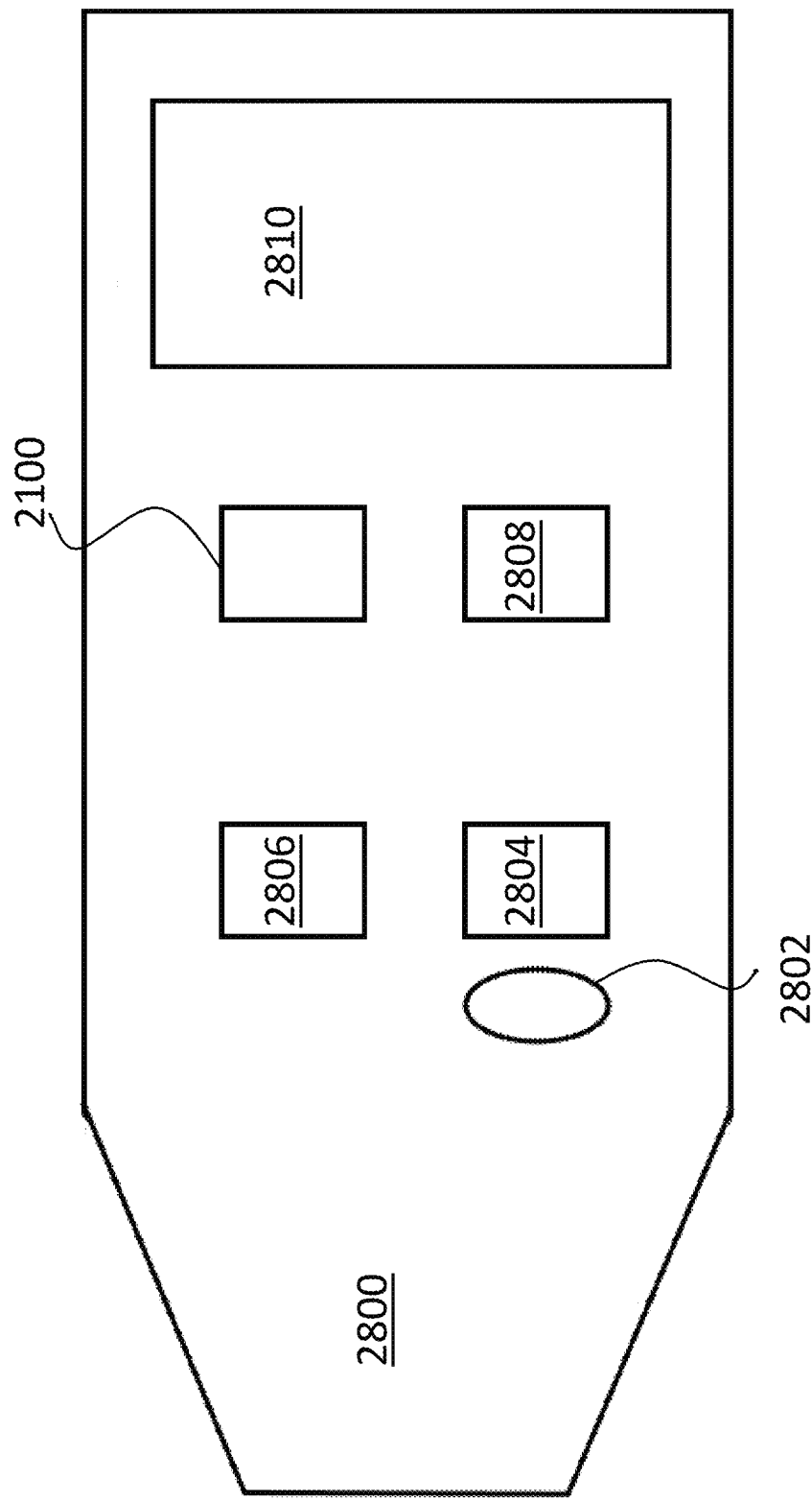
FIG. 28 illustrates a block diagram of a portable power case in an ATV with three passengers.

The four access ports are on the left side of the case in a preferred embodiment. FIG. 28 illustrates a block diagram of a portable power case in an ATV with three passengers. The ATV 2800 has a steering wheel 2802 and a seat for a driver 2804. A seat for a first passenger 2806 is to the right of the driver. The first passenger is responsible for maintaining the security of the right side of the ATV. A seat for a second passenger 2808 is behind the driver. The second passenger is responsible for maintaining the security of the left side of the ATV. The location of the first passenger and the second passenger allows for 360 degree visual coverage of the landscape surrounding the ATV. The portable power case 2100 is located to the right of the second passenger. Placing the access ports on the left side of the case prevents the second passenger and/or gear from knocking the cables connected to the case loose from the access ports. The trunk 2810 is available for storing additional gear.

Figure 29:
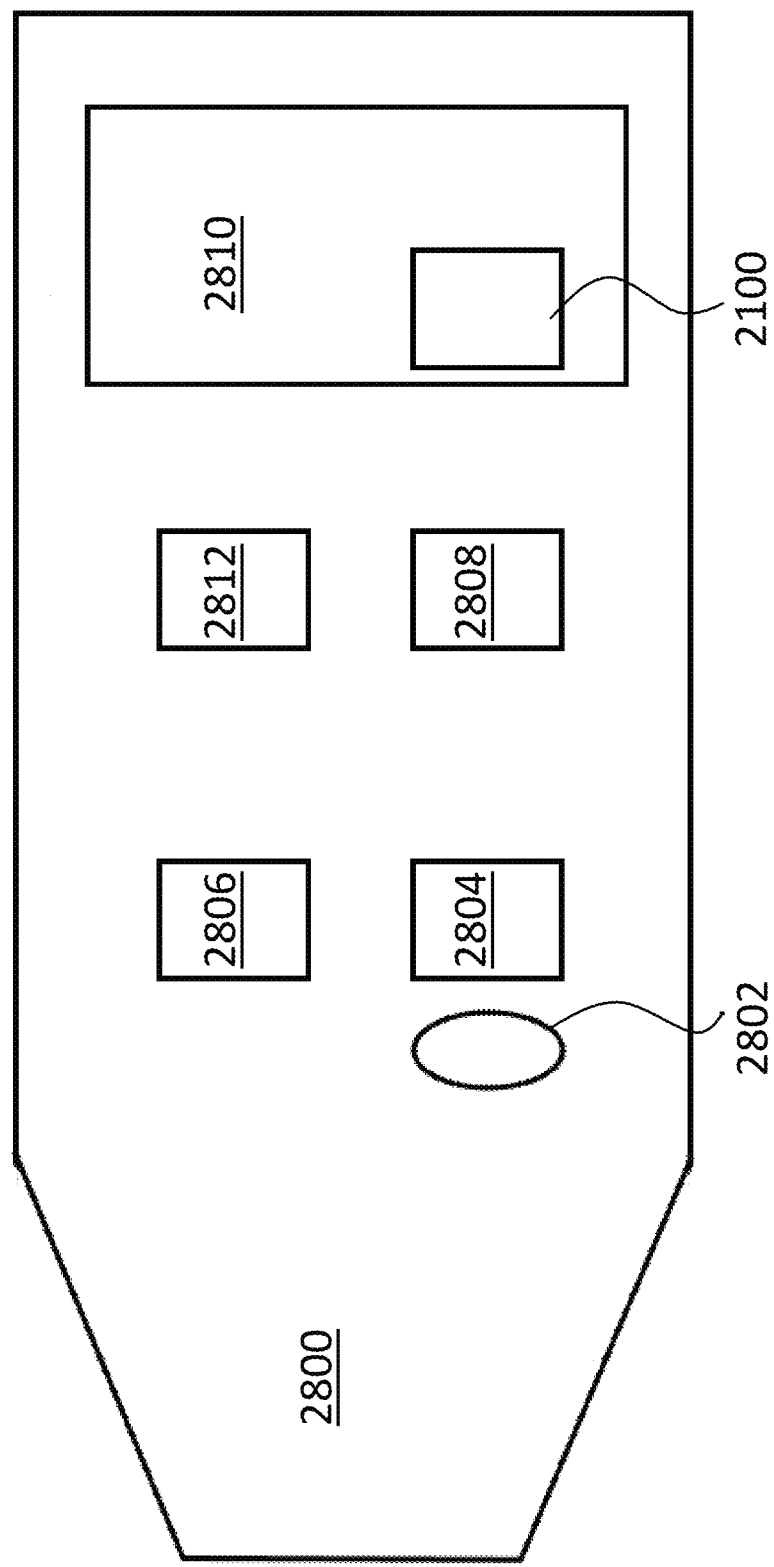
FIG. 29 illustrates a block diagram of a portable power case in an ATV with four passengers.

FIG. 29 illustrates a block diagram of a portable power case in an ATV with four passengers. The ATV 2800 has a steering wheel 2802 and a seat for a driver 2804. A seat for a first passenger 2806 is to the right of the driver. A seat for a second passenger 2808 is behind the driver. The second passenger is responsible for maintaining the security of the left side of the ATV. A seat for a third passenger 2812 is to the right of the seat for the third passenger 2808. The portable power case 2100 is placed in the trunk 2810.

The portable power case has two USB ports for charging electronic devices (e.g., mobile phone, tablet, smartphone, camera, global positioning system devices (GPS), thermal imaging devices, weapon optics, watches, satellite phones, defense advanced GPS receivers) in a preferred embodiment. The USB ports are preferably located on the front side of the case. Alternatively, the USB ports are located on the left or right side of the case.

The system allows the portable power case to charge using the vehicle battery after the ignition is turned off. The system includes a battery protector to prevent users from being stranded due to a drained vehicle battery.

Figure 30:
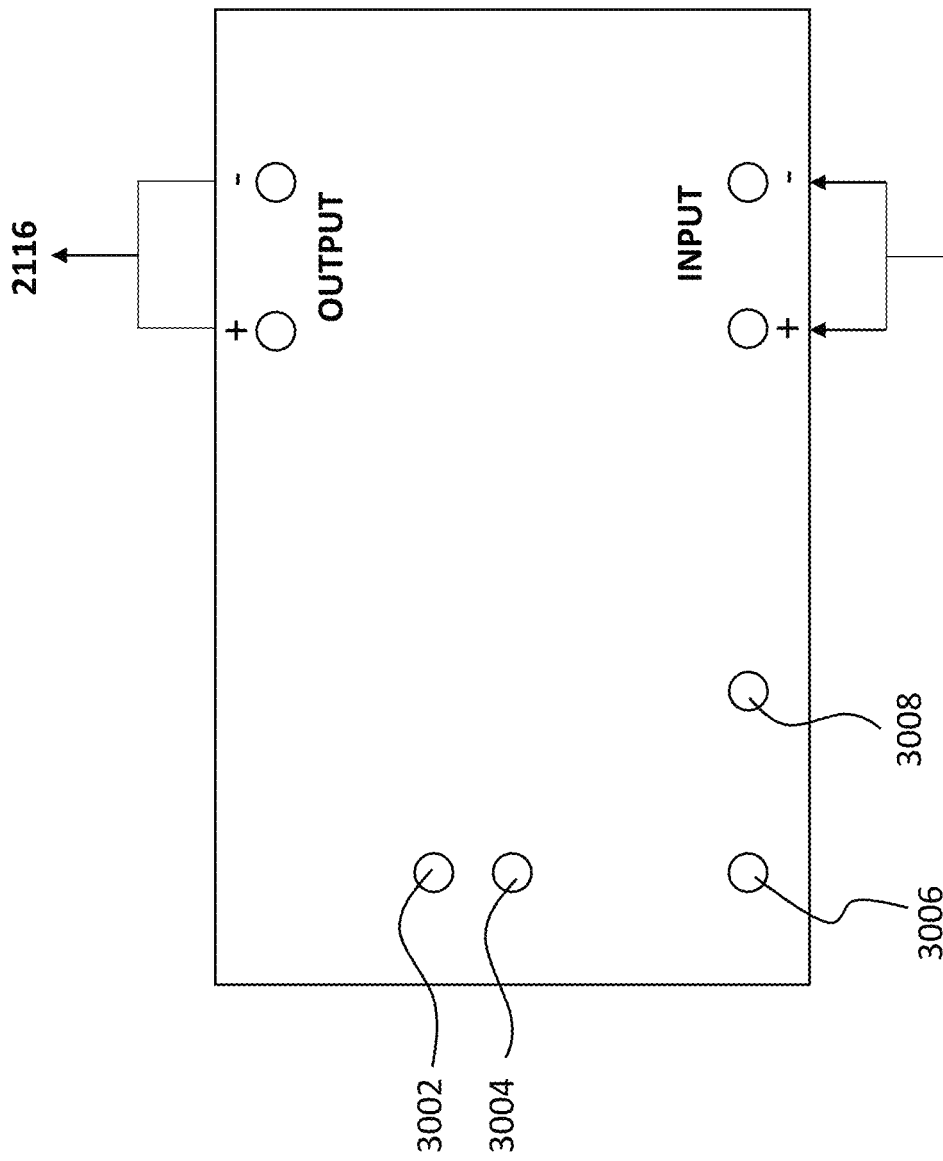
FIG. 30 illustrates a block diagram of the battery protector.

FIG. 30 illustrates a block diagram of the battery protector. The battery protector includes INPUT from the vehicle battery 2112 and OUTPUT to the DC-DC converter 2116. A green LED 3002 and a red LED 3004 provide visual information regarding the current charge status. The battery protector includes a rotary switch 3008 to select a desired time or voltage setting.

In one embodiment, the battery protector is a timer set to a time where the load will not drain the battery (e.g., 2 minutes, 15 minutes, 30 minutes, 1 hour, 2 hours, 3 hours, 4 hours, 5 hours, 8 hours, or 12 hours). Additionally or alternatively, the battery protector is a low voltage disconnect (LVD) that automatically disconnects the load when the vehicle battery voltage falls below a set DC voltage (e.g., 10.6V, 10.8V, 11.0V, 11.2V, 11.4V, 11.6V, 11.8V, 12.0V, 12.1V, or 12.2V). In one embodiment, the battery protector automatically reconnects the load when the battery voltage returns to a normal value (e.g., above the set DC voltage) after charging.

The battery protector has over voltage protection that automatically disconnects the load when the battery protector detects a voltage higher than a set DC voltage (e.g., above 16V) in a preferred embodiment. In one embodiment, the battery protector automatically reconnects the load when the detected voltage falls below the set DC voltage (e.g., below 16V).

The battery protector includes an emergency override switch 3006 in one embodiment. This allows the load to charge using the vehicle battery for an additional period of time (e.g., 15 minutes) in an emergency by overriding a timed-out timer.

In a preferred embodiment, the battery protector includes a visual indicator (e.g., LED lights) to indicate a current status. In one embodiment, the battery protector has a green LED light to indicate that the engine is running and the load is charging; a flashing green LED light to indicate that the vehicle engine is off, the timer has started, and the load is charging; a flashing red LED light to indicate that the timer has expired and the load is no longer charging; a slow flashing red LED light to indicate that the vehicle battery voltage is below the set DC voltage and the load is no longer charging; and a solid red light to indicate an overvoltage condition. The battery protector is preferably waterproof.

The system also allows the portable power case to charge using at least one alternating current (AC) adapter. All four access ports are operable to be used to charge the portable power case. In one embodiment, the power is operable to be charged in 16 hours using one AC adapter, 8 hours using two AC adapters, and 4 hours using four AC adapters.

In a preferred embodiment, the at least one AC adapter accepts a 100-240 VAC input and has a DC output of 17.4V. In one embodiment, the at least one AC adapter has an indicator for the charge state (e.g., red/orange indicates charging and green indicates charged).

In a preferred embodiment, the solar panel includes a combination signal marker panel and solar panel, such as that disclosed in US Publication No. 20150200318 and U.S. application Ser. No. 15/390,802, each of which is incorporated by reference in its entirety.

In a preferred embodiment, the solar cells are formed of a microsystem enabled photovoltaic (MEPV) material, such as that disclosed in U.S. Pat. Nos. 8,736,108, 9,029,681, 9,093,586, 9,143,053, 9,141,143, 9,496,448, 9,508,881, 9,531,322, 9,548,411, 9,559,219 and US Publication Nos. 20150114444 and 20150114451, each of which is incorporated by reference in its entirety. The signal marker panel is fluorescent orange (or "international orange") on a first side and cerise on a second side.

The system is operable to be also charged using non-rechargeable batteries (e.g., BA-5590) and NATO generators.

The wearable battery 2108 is preferably the battery shown in FIG. 12B, wherein the battery is lined with a first layer of the heat-shielding or blocking, heat-dissipating and/or heat signature-reducing material and a second layer of the heat-shielding or blocking, heat-dissipating and/or heat signature-reducing material, e.g., in a layer or lining, or coating application.

The above-mentioned examples are provided to serve the purpose of clarifying the aspects of the invention, and it will be apparent to one skilled in the art that they do not serve to limit the scope of the invention. By way of example, the keyway may force the cable at an angle other than 30.0°. Voltages of batteries may be different.

The above-mentioned examples are just some of the many configurations that the mentioned components can take on. All modifications and improvements have been deleted herein for the sake of conciseness and readability but are properly within the scope of the present invention.

The invention claimed is:

1. A battery housing unit comprising:
   a lid;
   a base;
   a plurality of electrochemical battery cells removably provided within the base; and
   a layer comprising polyethylene and copper functionally positioned between the lid and the plurality of electrochemical battery cells;
   wherein the base further includes:
     a first draw latch and a second draw latch secured to the base;
     wherein the first draw latch and the second draw latch are operable to attach the battery housing unit to a corresponding catch of a military radio;
     at least one recessed portion including at least one recessed hole and at least one connector secured in the at least one recessed hole;
     wherein the at least one recessed hole is substantially circular except for a flat portion of the at least one recessed hole, wherein the flat portion facilitates installation of the at least one connector; and
     wherein the at least one connector includes a keyway, wherein the keyway ensures a correct orientation of a cable attached to the at least one connector, wherein the keyway angles the cable away from the first draw latch or the second draw latch.

2. The battery housing unit of claim 1, further including a coating comprising copper on an interior surface of the base.

3. The battery housing unit of claim 1, wherein the lid includes a lid connector and a lid recessed portion.

4. The battery housing unit of claim 1, wherein the base comprises a composite metal foam.

5. The battery housing unit of claim 1, further including a second layer comprising polyethylene and copper, wherein the second layer comprising polyethylene and copper completely covers an interior surface of the base.

6. The battery housing unit of claim 1, further including at least one dust cap attached to the base.

7. The battery housing unit of claim 1, wherein the layer includes one or more of a material selected from a group consisting of an anti-static material, an anti-radiofrequency material, an anti-electromagnetic interference material, an anti-corrosion material, an anti-tarnish material, and combinations thereof.

8. The battery housing unit of claim 1, wherein the layer is positioned between a first substrate and a second substrate.

9. The battery housing unit of claim 1, wherein the layer includes at least one fold and/or at least one bump.

10. The battery housing unit of claim 1, wherein the base comprises a unitary and integrally formed piece of plastic formed via injection molding.

11. The battery housing unit of claim 1, wherein the plurality of electrochemical battery cells is contained in at least one casing.

12. The battery housing unit of claim 1, wherein the layer further comprises aluminum.

13. The battery housing unit of claim 1, wherein the base comprises aluminum, titanium, nickel, magnesium, a microlattice metal, and/or a composite metal foam.

14. The battery housing unit of claim 1, wherein the correct orientation of the cable is a thirty-degree angle relative to the base.

15. The battery housing unit of claim 1, wherein the at least one recessed portion is located at a bottom of a side of the base and extends from a bottom edge of the base towards a center of the base such that the at least one recessed portion includes four interior sides.

16. The battery housing unit of claim 15, wherein the four interior sides include a first interior side, a second interior side, a third interior side, and a fourth interior side, wherein the first interior side, the second interior side, and the third interior side include tapered edges, wherein each tapered edge includes a taper from an interior of the at least one recessed portion to the side of the base including the at least one recessed portion, and wherein the fourth interior side includes the at least one recessed hole.

17. A battery housing unit comprising:
    a lid;
    a base;
    a plurality of electrochemical battery cells removably provided within the base; and
    a layer comprising polyethylene and copper functionally positioned between the lid and the plurality of electrochemical battery cells;
    wherein the base further includes:
        a first draw latch and a second draw latch secured to the base;
        wherein the first draw latch and the second draw latch are operable to attach the battery housing unit to a corresponding catch of a military radio;
        at least one recessed portion including at least one recessed hole and at least one connector secured in the at least one recessed hole;
        wherein the at least one recessed hole is substantially circular except for a flat portion of the at least one recessed hole, wherein the flat portion facilitates installation of the at least one connector;
        wherein the at least one connector includes a keyway, wherein the keyway ensures a correct orientation of a right-angle cable attached to the at least one connector, wherein the keyway angles the right-angle cable away from the first draw latch or the second draw latch; and
        at least one dust cap to cover the at least one connector.

18. A battery housing unit comprising:
    a lid;
    a base;
    a plurality of electrochemical battery cells removably provided within the base; and
    a layer comprising polyethylene and copper functionally positioned between the lid and the plurality of electrochemical battery cells;
    wherein the base further includes:
        a first mounting plaque;
        a second mounting plaque;
        a first draw latch secured to the first mounting plaque;
        a second draw latch secured to the second mounting plaque;
        wherein the first draw latch and the second draw latch are operable to attach the battery housing unit to a corresponding catch of a military radio;
        at least one recessed portion including at least one recessed hole and at least one connector secured in the at least one recessed hole;
        wherein the at least one recessed hole is substantially circular except for a flat portion of the at least one recessed hole, wherein the flat portion facilitates installation of the at least one connector; and
        wherein the at least one connector includes a keyway, wherein the keyway ensures a correct orientation of a cable attached to the at least one connector, wherein the keyway angles the cable away from the first draw latch or the second draw latch.

19. The battery housing unit of claim 18, further including at least one dust cap to cover the at least one connector.

20. The battery housing unit of claim 19, wherein the at least one dust cap is attached to the base via a lanyard attached to the first mounting plaque or the second mounting plaque.

* * * * *